(12) United States Patent
Kwok

(10) Patent No.: US 12,301,252 B2
(45) Date of Patent: May 13, 2025

(54) CHECK NODE DATA COMPRESSION IN MEMORY SYSTEMS

(71) Applicant: SK Hynix NAND Product Solutions Corp., Rancho Cordova, CA (US)

(72) Inventor: Zion Kwok, Burnaby (CA)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 4 days.

(21) Appl. No.: 18/221,819

(22) Filed: Jul. 13, 2023

(65) Prior Publication Data
US 2025/0023580 A1  Jan. 16, 2025

(51) Int. Cl.
H03M 13/11 (2006.01)

(52) U.S. Cl.
CPC .... *H03M 13/1125* (2013.01); *H03M 13/1114* (2013.01)

(58) Field of Classification Search
None
See application file for complete search history.

(56) References Cited

U.S. PATENT DOCUMENTS

| | | | |
|---|---|---|---|
| 8,560,918 B1 * | 10/2013 | Yang | G06F 11/10 714/763 |
| 10,374,630 B2 | 8/2019 | Kim et al. | |
| 2010/0268918 A1 | 10/2010 | Priewasser et al. | |
| 2013/0283131 A1 * | 10/2013 | Tsatsaragkos | H03M 13/6505 714/776 |
| 2017/0177259 A1 * | 6/2017 | Motwani | H03M 13/2909 |
| 2021/0013903 A1 * | 1/2021 | Vanaparthy | H03M 13/1102 |
| 2022/0164143 A1 * | 5/2022 | Kim | G11C 16/26 |
| 2023/0065578 A1 | 3/2023 | Hwang et al. | |

FOREIGN PATENT DOCUMENTS

| | | | | |
|---|---|---|---|---|
| CN | 114826282 A | | 7/2022 | |
| WO | WO-2007073113 A1 * | | 6/2007 | ............ H03M 13/27 |
| WO | WO-2021061574 A1 * | | 4/2021 | ......... H03M 13/1111 |

OTHER PUBLICATIONS

Ali Chamas Al Ghouwayel, Mohammed Wehbi and Malak Mrad, Compression of LLR Messages of an Elementary Check Node Processor of a Non-Binary LDPC (Year: 2013).*

(Continued)

*Primary Examiner* — Guerrier Merant
(74) *Attorney, Agent, or Firm* — Morgan, Lewis & Bockius LLP

(57) ABSTRACT

This application is directed to compressing check node data for an electronic device. The electronic device identifies a check node corresponding to a subset of codeword symbols in a block of data and determines check node data that indicates a likelihood of the subset of codeword symbols being erroneous. A set of data bits are determined based on a value combination of data items of the check node data to uniquely identify the value combination among a set of selected value combinations according to a predefined relationship. The electronic device stores, in a memory block, the set of data bits representing the data items of the check node data of the check node. Each data item requires more data bits to represent all possible values of the respective data item than data bits of the set of data bits.

20 Claims, 20 Drawing Sheets

(56) References Cited

OTHER PUBLICATIONS

SK Hynix NAND Product Solutions Corp. (dba Solidigm), PCT/US2024/037929, International Search Report and Written Opinion, Oct. 29, 2024, 9 pgs.

Seyed Mohammad Ehsan Hosseini, "FPGA implementation of low-density parity-check (LDPC) coded recording channels", Master's thesis, Nanyang Technological University, Singapore, 2010, 149 pgs. [Retrieved on Oct. 17, 2024]. Retrieved from the Internet: <URL: https://dr.ntu.edu.sg/handle/10356/20856>.

\* cited by examiner

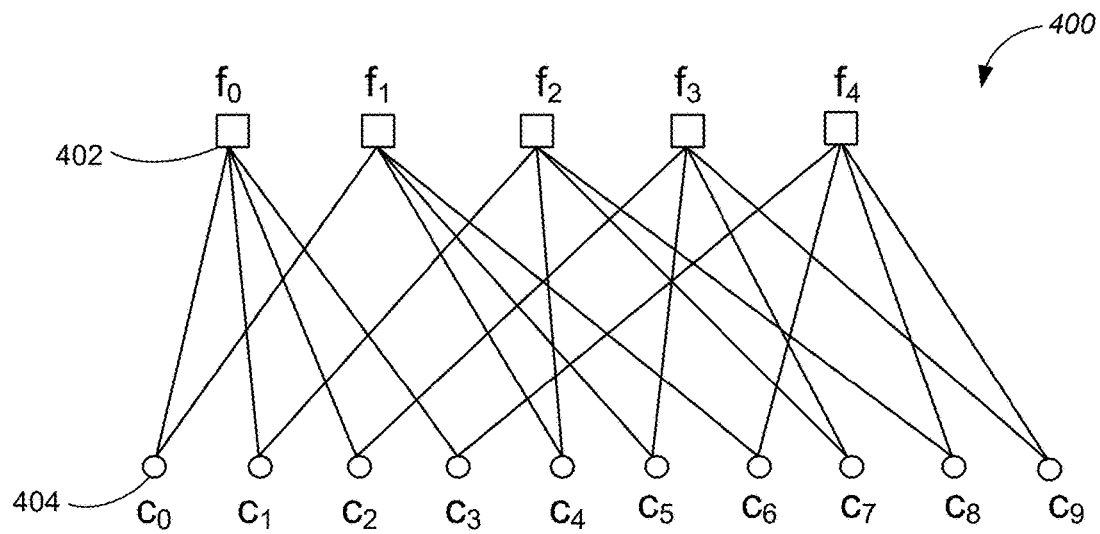
Figure 4A
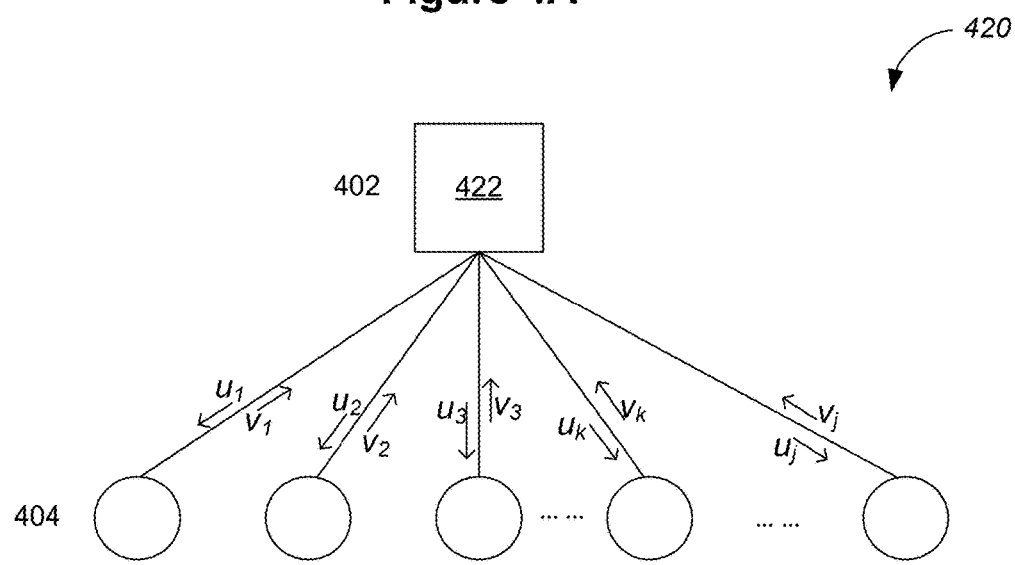
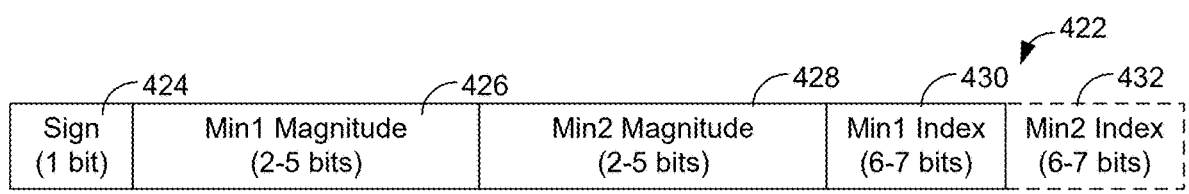
Figure 4B

900

Identify a plurality of check nodes associated with a block of data. 902

> Each check node corresponds to a subset of codeword symbols in the block of data and has respective check node data that indicates a likelihood of the subset of codeword symbols being erroneous. 904

For each of a subset of check nodes, identify a set of most significant bits (MSBs) of one or more data items in the respective check node data. 906

Determine a set of data bits based on a plurality of MSB sets of the subset of check nodes. 908

> The plurality of MSB sets includes the set of MSBs of the one or more data items in the respective check node data of each of the subset of check nodes. 910

Store the set of data bits in association with the subset of check nodes in a memory block allocated to the plurality of check nodes. 912

The plurality of MSB sets has a first number of bits in total, and the set of data bits has a second number of bits, the first number being greater than the second number. 914

| | | Min1 Magnitude 426 | | | | | | | |
|---|---|---|---|---|---|---|---|---|---|
| | | 0 | 1 | 2 | 3 | 4 | 5 | 6 | 7 |
| Min2 Magnitude 428 | 0 | 0 (00000) | x | x | x | x | x | x | x |
| | 1 | 0 | 0 (00001) | x | x | x | x | x | x |
| | 2 | 0 | 0 | 0 | x | x | x | x | x |
| | 3 | 0 | 0 | 0 | 0 | x | x | x | x |
| | 4 | 0 | 0 | 0 | 0 | 0 | x | x | x |
| | 5 | 0 | 0 | 0 | 0 | 0 | 0 | x | x |
| | 6 | x | x | x | x | 0 | 0 | 0 | x |
| | 7 | 0 (11000) | 0 (11001) | 0 (11010) | 0 (11011) | 0 (11100) | 0 (11101) | 0 (11110) | 0 (11111) |

1004-1, 1006, 1004-2, 1012, 1014

1002: | 1 | 0 | 1 | 1 | 0 |

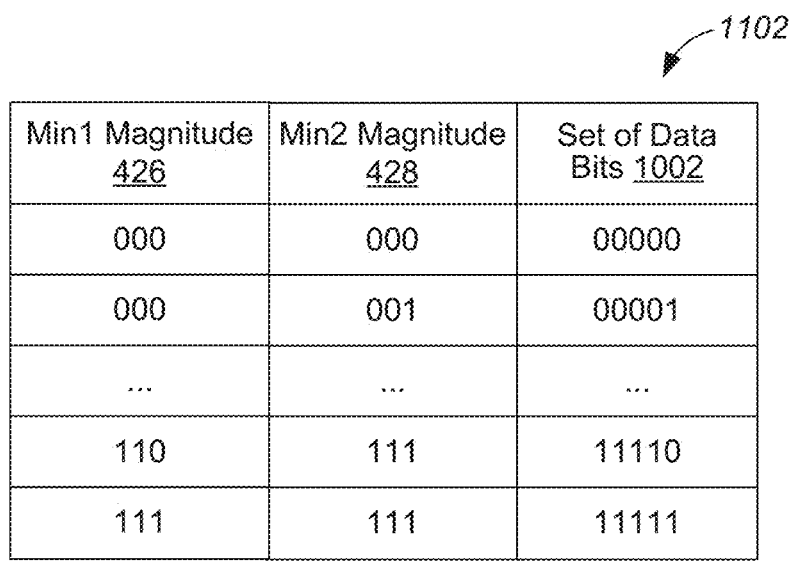
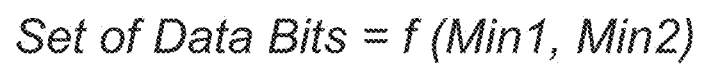
Figure 11

```
Identify a check node corresponding to a subset of codeword symbols in a
block of data. 1802
```

↓

```
Determine check node data including a plurality of data items, wherein the
check node data indicates a likelihood of the subset of codeword symbols being
erroneous. 1804
    The plurality of data items includes a first likelihood data item
    corresponding to a first codeword symbol and a second likelihood data
    item corresponding to a second codeword symbol, and the second
    likelihood data item is greater than or equal to the first likelihood data
    item. 1818

The plurality of data items further includes at least one of: a first index
    data item identifying one of the subset of codeword symbols
    corresponding to a first likelihood data of the check node data and a
    second index data item identifying one of the subset of codeword
    symbols corresponding to a second likelihood data of the check node
    data. 1820
```

↓

```
Determine a set of data bits based on a value combination of the plurality of
data items. 1806
    The set of data bits uniquely identifies the value combination among a
    set of selected value combinations according to a predefined
    relationship. 1808

The plurality of data items correspond to a total number of possible value
    combinations, and a binary data item that represents the total number
    has more bits than the set of data bits. 1816
```

↓

```
Store, in a memory block, the set of data bits representing the plurality of data
items of the check node data of the check node. 1810
    Each of the plurality of data items requires at least a first number of data
    bits to represent all possible values of the respective data item, and the
    set of data bits has a second number of data bits. 1812

The second number being smaller than a sum of the first number of each
    of the plurality of data items. 1814
```

```
┌─────────────────────────────────────────────────────────────────────────┐
│ Obtain a block of data corresponding to a plurality of first check nodes. 2002 │
│ ┌─────────────────────────────────────────────────────────────────────┐ │
│ │ Each first check node corresponds to a first subset of codeword symbols │ │
│ │ of the block of data, and has respective first check node data that   │ │
│ │ indicates a likelihood of the first subset of codeword symbols being  │ │
│ │ erroneous. 2004                                                       │ │
│ └─────────────────────────────────────────────────────────────────────┘ │
└─────────────────────────────────────────────────────────────────────────┘
                                    ▼
┌─────────────────────────────────────────────────────────────────────────┐
│ Identify a memory block allocated to store first check node data of the plurality │
│ of first check nodes. 2006                                              │
└─────────────────────────────────────────────────────────────────────────┘
                                    ▼
┌─────────────────────────────────────────────────────────────────────────┐
│ Regroup data bits of the block of data to form a plurality of second check │
│ nodes. 2008                                                             │
│ ┌─────────────────────────────────────────────────────────────────────┐ │
│ │ Each second check node corresponds to a second subset of codeword   │ │
│ │ symbols of the block of data, and has respective second check node  │ │
│ │ data that indicates a likelihood of the second subset of codeword   │ │
│ │ symbols being erroneous. 2010                                       │ │
│ └─────────────────────────────────────────────────────────────────────┘ │
└─────────────────────────────────────────────────────────────────────────┘
                                    ▼
┌─────────────────────────────────────────────────────────────────────────┐
│ Reconfigure the memory block to store second check node data of the plurality │
│ of second check nodes. 2012                                             │
│ ┌─────────────────────────────────────────────────────────────────────┐ │
│ │ The plurality of second check nodes having a distinct number of check │ │
│ │ nodes from the plurality of first check nodes. 2014                 │ │
│ └─────────────────────────────────────────────────────────────────────┘ │
│ ┌ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐ │
│   Identify one or more excessive bits in the respective first check node │
│ │ data of each of the plurality of first check nodes. 2016            │ │
│ └ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘ │
│                                  ▼                                      │
│ ┌ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐ │
│   Group excessive bits of the respective first check node data of a first │
│ │ subset of the plurality of first check nodes to store additional check node │ │
│   data of an additional check node of the plurality of second check nodes. │
│ │ 2018                                                                │ │
│ └ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘ │
│                                                                         │
│ ┌ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐ │
│   Identify one or more excessive check nodes in the plurality of first check │
│ │ nodes, excessive check node data of the one or more excessive check │ │
│   nodes forming a plurality of excessive bits. 2020                     │
│ └ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘ │
│                                  ▼                                      │
│ ┌ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐ │
│   Assign the plurality of excessive bits to second check node data of the │
│ │ plurality of second check nodes 2022                                │ │
│ └ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘ │
└─────────────────────────────────────────────────────────────────────────┘
```

Figure 20

CHECK NODE DATA COMPRESSION IN MEMORY SYSTEMS

TECHNICAL FIELD

This application relates generally to memory management including, but not limited to, methods, systems, and non-transitory computer-readable media for compressing check node data applied in data validation in a memory system (e.g., solid-state drive).

BACKGROUND

Memory is applied in a computer system to store instructions and data. The data are processed by one or more processors of the computer system according to the instructions stored in the memory. Multiple memory units are used in different portions of the computer system to serve different functions. Specifically, the computer system includes non-volatile memory that acts as secondary memory to keep data stored thereon if the computer system is decoupled from a power source. Examples of the secondary memory include, but are not limited to, hard disk drives (HDDs) and solid-state drives (SSDs). Min-sum is a popular algorithm for identifying and/or correcting bit errors of user data that is stored in the memory with integrity data (e.g., low-density parity-check (LDPC) codes). As a memory controller identifies or corrects the bit errors based on the LDPC codes during an integrity check process, the memory controller generates check node data and store it temporarily in registers. It would be beneficial to compress the check node data used in the integrity check process to reduce expensive register usage and enhance memory access performance.

SUMMARY

Various embodiments of this application are directed to methods, systems, devices, non-transitory computer-readable media for compressing check node data that is temporarily stored in registers during an integrity check process implemented by a memory system (e.g., an SSD). The check node data is applied to identify or correct bit errors in codeword symbols extracted from the memory system, and the codeword symbols are stored including integrity data, e.g., LDPC codes, which represents a class of error correcting codes employed to provide error correction of data storage errors in the memory system. In an example, min-sum is a popular algorithm applied to correct bit errors in the codeword symbols stored in the memory system. LDPC decoding is typically visualized as a bipartite Tanner graph with variable nodes and check nodes, and messages are exchanged between the variable and check nodes on the Tanner graph during the integrity check process. In some implementations, memory (e.g., registers) is allocated for each check node to store a plurality of data items summarizing information of a set of variable nodes connected to the respective check node. Various implementations of this application are directed to compressing check node data generated and temporarily stored during the integrity check process, thereby reducing expensive register usage and enhancing memory access performance.

In one aspect, a method is implemented at an electronic device to compress check node data on a memory system (e.g., solid-state drives). The method includes identifying a plurality of check nodes associated with a block of data. Each check node corresponds to a subset of codeword symbols in the block of data and has respective check node data that indicates a likelihood of the subset of codeword symbols being erroneous. The method further includes for each of a subset of check nodes, identifying a set of most significant bits (MSBs) of one or more data items in the respective check node data. The method further includes determining a set of data bits based on a plurality of MSB sets of the subset of check nodes. The plurality of MSB sets includes the set of MSBs of the one or more data items in the respective check node data of each of the subset of check nodes. The method further includes storing the set of data bits in association with the subset of check nodes in a memory block (e.g., a register file, one or more registers) allocated to the plurality of check nodes. The plurality of MSB sets has a first number of bits in total, and the set of data bits has a second number of bits. The first number is greater than the second number.

In another aspect, a method is implemented at an electronic device to compress check node data on a memory system (e.g., solid-state drives). The method includes identifying a check node corresponding to a subset of codeword symbols in a block of data and determining check node data including a plurality of data items. The check node data indicates a likelihood of the subset of codeword symbols being erroneous. The method further includes determining a set of data bits based on a value combination of the plurality of data items. The set of data bits uniquely identifies the value combination among a set of selected value combinations according to a predefined relationship. The method further includes storing, in a memory block, the set of data bits representing the plurality of data items of the check node data of the check node. Each of the plurality of data items requires at least a first number of data bits to represent all possible values of the respective data item, and the set of data bits has a second number of data bits. The second number is smaller than a sum of the first number of each of the plurality of data items.

In yet another aspect, a method is implemented at an electronic device to adaptively storing check node data on a memory system (e.g., solid-state drives). The method includes obtaining a block of data corresponding to a plurality of first check nodes. Each first check node corresponds to a first subset of codeword symbols of the block of data and has respective first check node data that indicates a likelihood of the first subset of codeword symbols being erroneous. The method further includes identifying a memory block allocated to store first check node data of the plurality of first check nodes and regrouping data bits of the block of data to form a plurality of second check nodes. Each second check node corresponds to a second subset of codeword symbols of the block of data and has respective second check node data that indicates a likelihood of the second subset of codeword symbols being erroneous. The method further includes reconfiguring the memory block to store second check node data of the plurality of second check nodes. The plurality of second check nodes has a distinct number of check nodes from the plurality of first check nodes.

Some implementations of this application include an electronic device that includes one or more processors and memory having instructions stored thereon, which when executed by the one or more processors cause the processors to perform any of the above methods on a memory system (e.g., solid-state drives).

Some implementations include a non-transitory computer readable storage medium storing one or more programs. The one or more programs include instructions, which when executed by one or more processors cause the processors to implement any of the above methods on a memory system (e.g., solid-state drives).

In some embodiments, the above methods, electronic devices, or non-transitory computer readable storage medium for managing LDPC-based check node data are also used in communication (e.g., wireless communication using 5G or Wi-Fi technology, satellite communications, Ethernet communication, and communication via fiber optic networks).

These illustrative embodiments and implementations are mentioned not to limit or define the disclosure, but to provide examples to aid understanding thereof. Additional embodiments are discussed in the Detailed Description, and further description is provided there.

BRIEF DESCRIPTION OF THE DRAWINGS

For a better understanding of the various described implementations, reference should be made to the Detailed Description below, in conjunction with the following drawings in which like reference numerals refer to corresponding parts throughout the figures.

FIG. 4A is a Tanner graph applied to implement LDPC coding using check nodes and variable nodes, in accordance with some embodiments.

FIG. 4B is a simplified Tanner graph having a single check node coupled to a set of variable nodes, in accordance with some embodiments.

FIG. 9 is a flow diagram of an example method for compressing check node data for an electronic device, in accordance with some embodiments.

FIG. 10 is a data map illustrating example value combinations of two likelihood data items of check node data of each check node, in accordance with some embodiments.

FIG. 11 illustrates a lookup table and a formula applied to associate value combinations of two data items of check node data with a set of data bits, in accordance with some embodiments.

FIGS. 13-16 are example data maps illustrating different lossy value combinations of two data items of check node data of each check node, in accordance with some embodiments.

FIG. 18 is a flow diagram of an example method for compressing check node data for an electronic device, in accordance with some embodiments.

FIG. 20 is a flow diagram of an example method for adaptively storing check node data in an electronic device, in accordance with some embodiments.

Like reference numerals refer to corresponding parts throughout the several views of the drawings.

DETAILED DESCRIPTION

Figure 1:
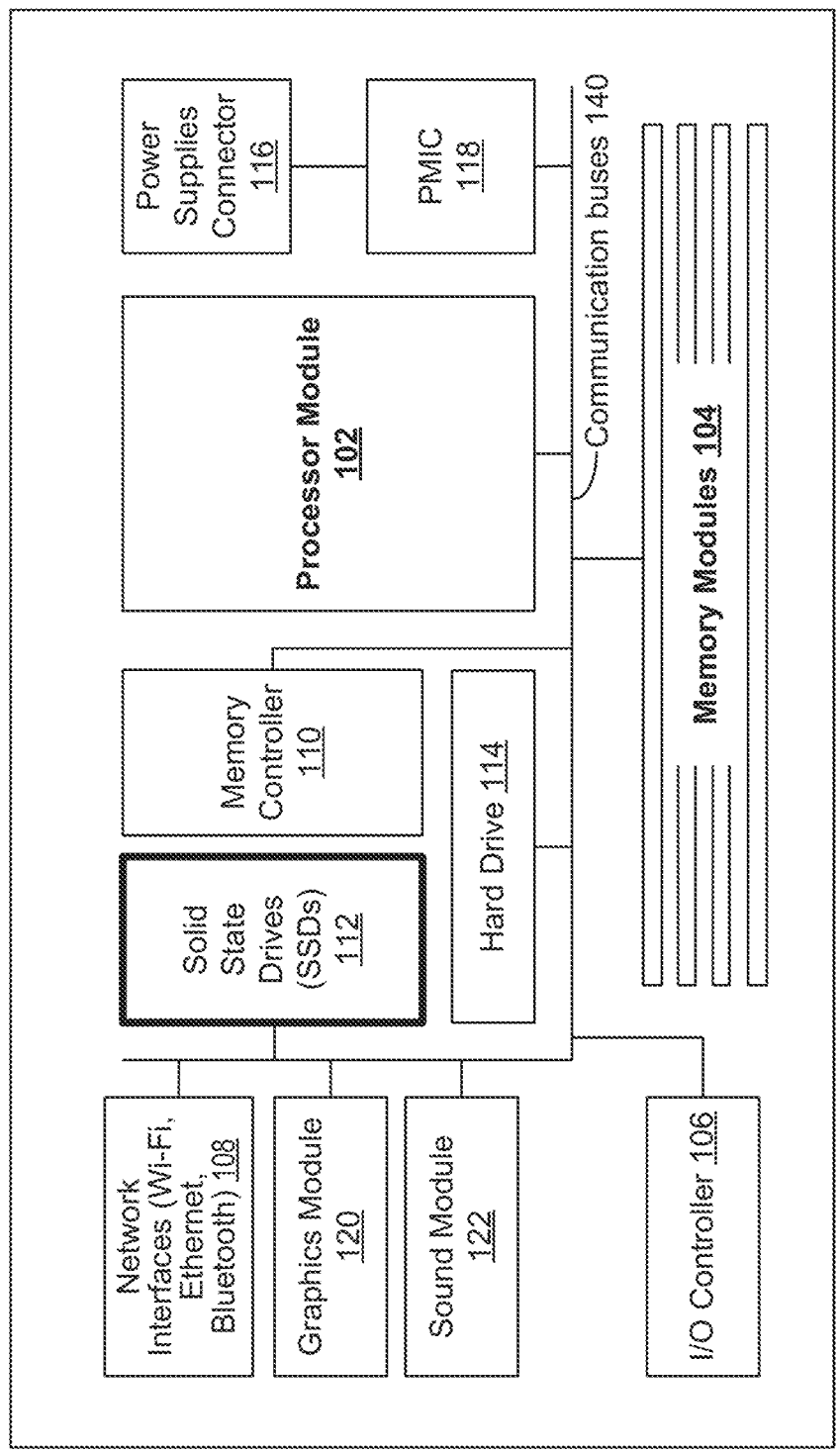
FIG. 1 is a block diagram of an example system module in a typical electronic device in accordance with some embodiments.

Reference will now be made in detail to specific embodiments, examples of which are illustrated in the accompanying drawings. In the following detailed description, numerous non-limiting specific details are set forth in order to assist in understanding the subject matter presented herein. But it will be apparent to one of ordinary skill in the art that various alternatives may be used without departing from the scope of claims and the subject matter may be practiced without these specific details. For example, it will be apparent to one of ordinary skill in the art that the subject matter presented herein can be implemented on many types of electronic devices with digital video capabilities.

This application is directed to compressing check node data that is temporarily stored in registers during an integrity check process implemented by a memory system (e.g., an SSD). The check node data is applied to identify or correct bit errors in codeword symbols extracted from the memory system, and the codeword symbols include integrity data, e.g., LDPC codes, which represents a class of error correcting codes employed to provide error correction of data storage errors in the memory system. In an example, min-sum is a popular algorithm applied to correct bit errors in the LDPC codes. LDPC decoding is typically visualized as a Tanner graph with variable nodes and check nodes, and messages are exchanged between the variable and check nodes on the Tanner graph during the integrity check process. In some implementations, memory (e.g., registers) is allocated for each check node to store a plurality of data items summarizing information of a set of variable nodes connected to the respective check node. Check node data generated and temporarily stored is compressed during the integrity check process, thereby reducing expensive register usage and enhancing memory access performance.

In an example, each check node stores a sign, a smallest message (Min1) magnitude, a second smallest message (Min2) magnitude, an index identifying the variable node that provides the smallest message (Min1 index), and optionally a Min2 index identifying the variable node that provides the second smallest message (Min2 index). The Min1 magnitude is always less than or equal to the Min2 magnitude, thereby creating a method for data compression. Moreover, in some embodiments, the Min1 index and Min2 index are limited to a maximum check node degree (i.e., a number of variable nodes coupled to each check node) that is not a power of two, and some index values are never used, which is used for data compression. In some embodiments, the Min2 magnitude and Min2 index are less important than the Min1 magnitude and Min1 index, so some bits can be truncated without causing a noticeable negative impact. In some embodiments, a decoder is re-used for multiple matrices. For example, smaller matrices having higher check node degrees are reconfigured in an exchangeable manner to larger matrices having smaller check node degrees. Some unused storage space in large matrices is optionally used for increasing the Min1 index and Min2 index sizes for small matrices. Conversely, the index sizes of small matrices are reduced to increase the number of check nodes stored for the large matrices.

Memory System of an Electronic Device

FIG. 1 is a block diagram of an example system module 100 in a typical electronic device in accordance with some embodiments. The system module 100 in this electronic device includes at least a processor module 102, memory modules 104 for storing programs, instructions and data, an input/output (I/O) controller 106, one or more communication interfaces such as network interfaces 108, and one or more communication buses 140 for interconnecting these components. In some embodiments, the I/O controller 106 allows the processor module 102 to communicate with an I/O device (e.g., a keyboard, a mouse or a track-pad) via a universal serial bus interface. In some embodiments, the network interfaces 108 includes one or more interfaces for Wi-Fi, Ethernet and Bluetooth networks, each allowing the electronic device to exchange data with an external source, e.g., a server or another electronic device. In some embodiments, the communication buses 140 include circuitry (sometimes called a chipset) that interconnects and controls communications among various system components included in system module 100.

In some embodiments, the memory modules 104 include high-speed random-access memory, such as DRAM, static random-access memory (SRAM), double data rate (DDR) dynamic random-access memory (RAM), or other random-access solid state memory devices. In some embodiments, the memory modules 104 include non-volatile memory, such as one or more magnetic disk storage devices, optical disk storage devices, flash memory devices, or other non-volatile solid state storage devices. In some embodiments, the memory modules 104, or alternatively the non-volatile memory device(s) within the memory modules 104, include a non-transitory computer readable storage medium. In some embodiments, memory slots are reserved on the system module 100 for receiving the memory modules 104. Once inserted into the memory slots, the memory modules 104 are integrated into the system module 100.

In some embodiments, the system module 100 further includes one or more components selected from a memory controller 110, SSDs 112, a hard disk drive (HDD) 114, power management integrated circuit (PMIC) 118, a graphics module 120, and a sound module 122. The memory controller 110 is configured to control communication between the processor module 102 and memory components, including the memory modules 104, in the electronic device. The SSDs 112 are configured to apply integrated circuit assemblies to store data in the electronic device, and in many embodiments, are based on NAND or NOR memory configurations. The HDD 114 is a conventional data storage device used for storing and retrieving digital information based on electromechanical magnetic disks. The power supply connector 116 is electrically coupled to receive an external power supply. The PMIC 118 is configured to modulate the received external power supply to other desired DC voltage levels, e.g., 5V, 3.3V or 1.8V, as required by various components or circuits (e.g., the processor module 102) within the electronic device. The graphics module 120 is configured to generate a feed of output images to one or more display devices according to their desirable image/video formats. The sound module 122 is configured to facilitate the input and output of audio signals to and from the electronic device under control of computer programs.

It is noted that communication buses 140 also interconnect and control communications among various system components including components 110-122.

Further, one skilled in the art knows that other non-transitory computer readable storage media can be used, as new data storage technologies are developed for storing information in the non-transitory computer readable storage media in the memory modules 104 and in SSDs 112. These new non-transitory computer readable storage media include, but are not limited to, those manufactured from biological materials, nanowires, carbon nanotubes and individual molecules, even though the respective data storage technologies are currently under development and yet to be commercialized.

Some implementations of this application are directed to an integrity check process implemented by a memory system (e.g., SSDs 112, memory module 104, hard drive 114, memory controller 110), which stores codeword symbols including integrity data, e.g., LDPC codes. The integrity check process is also called a decoding process and visualized by a Tanner graph with variable nodes and check nodes. The variable nodes correspond to the codeword symbols extracted from the memory system. Each check node corresponds to a distinct set of variable nodes, and has check node data configured to identify or correct bit errors in the codeword symbols corresponding to the distinct set of variable nodes. Specifically, messages are exchanged between the variable and check nodes on the Tanner graph to update the check node data, until the bit errors are identified and corrected in the codeword symbols. During the integrity check process, the check node data are generated and temporarily stored in registers or a register file of the memory system. In some embodiments, the check node data of two or more check nodes are compressed jointly to save one or more bits in the registers or register file, e.g., in a lossless manner. In some embodiments, two or more data items of check node data of a single check node are compressed jointly to save one or more bits in the registers or register file, e.g., in a lossless or lossy manner. In some embodiments, a memory space is reconfigured to store check node data for two distinct numbers of check nodes, and a data structure of the check node data is adjusted when the check node data is switched between two data structures corresponding to two distinct numbers of check nodes. By these means, register space allocated to the registers or register file is reduced, and storage space of the memory system is utilized efficiently with little or no impact on performance of the data integrity check process.

Figure 2:
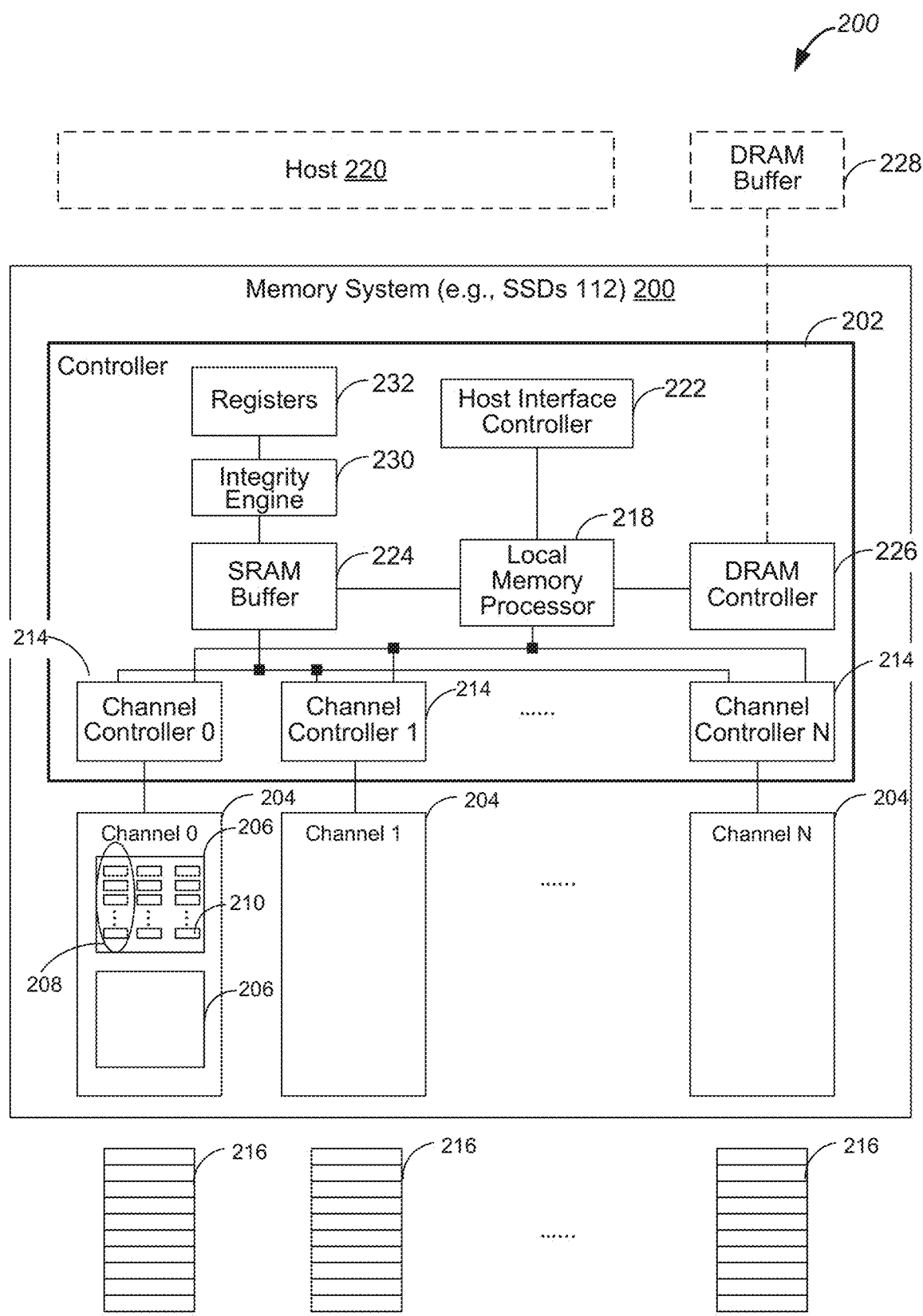
FIG. 2 is a block diagram of a memory system of an example electronic device having one or more memory access queues, in accordance with some embodiments.

FIG. 2 is a block diagram of a memory system 200 of an example electronic device having one or more memory access queues, in accordance with some embodiments. The memory system 200 is coupled to a host device 220 (e.g., a processor module 102 in FIG. 1) and configured to store instructions and data for an extended time, e.g., when the electronic device sleeps, hibernates, or is shut down. The host device 220 is configured to access the instructions and data stored in the memory system 200 and process the instructions and data to run an operating system and execute user applications. The memory system 200 further includes a controller 202 and a plurality of memory channels 204. Each memory channel 204 includes a plurality of memory cells. The controller 202 is configured to execute firmware level software to bridge the plurality of memory channels 204 to the host device 220.

Each memory channel 204 includes on one or more memory packages 206 (e.g., two memory chips, two memory dies). In an example, each memory package 206 corresponds to a memory die. Each memory package 206 includes a plurality of memory planes 208, and each memory plane 208 further includes a plurality of memory pages 210. Each memory page 210 includes an ordered set of memory cells, and each memory cell is identified by a respective physical address. In some embodiments, the memory system 200 includes a single-level cell (SLC) NAND flash memory chip, and each memory cell stores a single data bit. In some embodiments, the memory system 200 includes a multi-level cell (MLC) NAND flash memory chip, and each memory cell of the MLC NAND flash memory chip stores 2 data bits. In an example, each memory cell of a triple-level cell (TLC) NAND flash memory chip stores 3 data bits. In another example, each memory cell of a quad-level cell (QLC) NAND flash memory chip stores 4 data bits. In yet another example, each memory cell of a penta-level cell (PLC) NAND flash memory chip stores 5 data bits. In some embodiments, each memory cell can store any suitable number of data bits. Compared with the non-SLC NAND flash memory chips (e.g., MLC SSD, TLC SSD, QLC SSD, PLC SSD), the SSD that has SLC NAND flash memory chips operates with a higher speed, a higher reliability, and a longer lifespan, and however, has a lower device density and a higher price.

Each memory channel 204 is coupled to a respective channel controller 214 configured to control internal and external requests to access memory cells in the respective memory channel 204. In some embodiments, each memory package 206 (e.g., each memory die) corresponds to a respective queue 216 of memory access requests. In some embodiments, each memory channel 204 corresponds to a respective queue 216 of memory access requests. Further, in some embodiments, each memory channel 204 corresponds to a distinct and different queue 216 of memory access requests. In some embodiments, a subset (less than all) of the plurality of memory channels 204 corresponds to a distinct queue 216 of memory access requests. In some embodiments, all of the plurality of memory channels 204 of the memory system 200 corresponds to a single queue 216 of memory access requests. Each memory access request is optionally received internally from the memory system 200 to manage the respective memory channel 204 or externally from the host device 220 to write or read data stored in the respective channel 204. Specifically, each memory access request includes one of: a system write request that is received from the memory system 200 to write to the respective memory channel 204, a system read request that is received from the memory system 200 to read from the respective memory channel 204, a host write request that originates from the host device 220 to write to the respective memory channel 204, and a host read request that is received from the host device 220 to read from the respective memory channel 204. It is noted that system read requests (also called background read requests or non-host read requests) and system write requests are dispatched by a memory controller to implement internal memory management functions including, but are not limited to, garbage collection, wear levelling, read disturb mitigation, memory snapshot capturing, memory mirroring, caching, and memory sparing.

In some embodiments, in addition to the channel controllers 214, the controller 202 further includes a local memory processor 218, a host interface controller 222, an SRAM buffer 224, and a DRAM controller 226. The local memory processor 218 accesses the plurality of memory channels 204 based on the one or more queues 216 of memory access requests. In some embodiments, the local memory processor 218 writes into and read from the plurality of memory channels 204 on a memory block basis. Data of one or more memory blocks are written into, or read from, the plurality of channels jointly. No data in the same memory block is written concurrently via more than one operation. Each memory block optionally corresponds to one or more memory pages. In an example, each memory block to be written or read jointly in the plurality of memory channels 204 has a size of 16 KB (e.g., one memory page). In another example, each memory block to be written or read jointly in the plurality of memory channels 204 has a size of 64 KB (e.g., four memory pages). In some embodiments, each page has 16 KB user data and 2 KB metadata. Additionally, a number of memory blocks to be accessed jointly and a size of each memory block are configurable for each of the system read, host read, system write, and host write operations.

In some embodiments, the local memory processor 218 stores data to be written into, or read from, each memory block in the plurality of memory channels 204 in an SRAM buffer 224 of the controller 202. Alternatively, in some embodiments, the local memory processor 218 stores data to be written into, or read from, each memory block in the plurality of memory channels 204 in a DRAM buffer 228 that is in memory system 200. Alternatively, in some embodiments, the local memory processor 218 stores data to be written into, or read from, each memory block in the plurality of memory channels 204 in a DRAM buffer 228 that is main memory used by the processor module 102 (FIG. 1). The local memory processor 218 of the controller 202 accesses the DRAM buffer 228 via the host interface controller 222.

Figure 3:
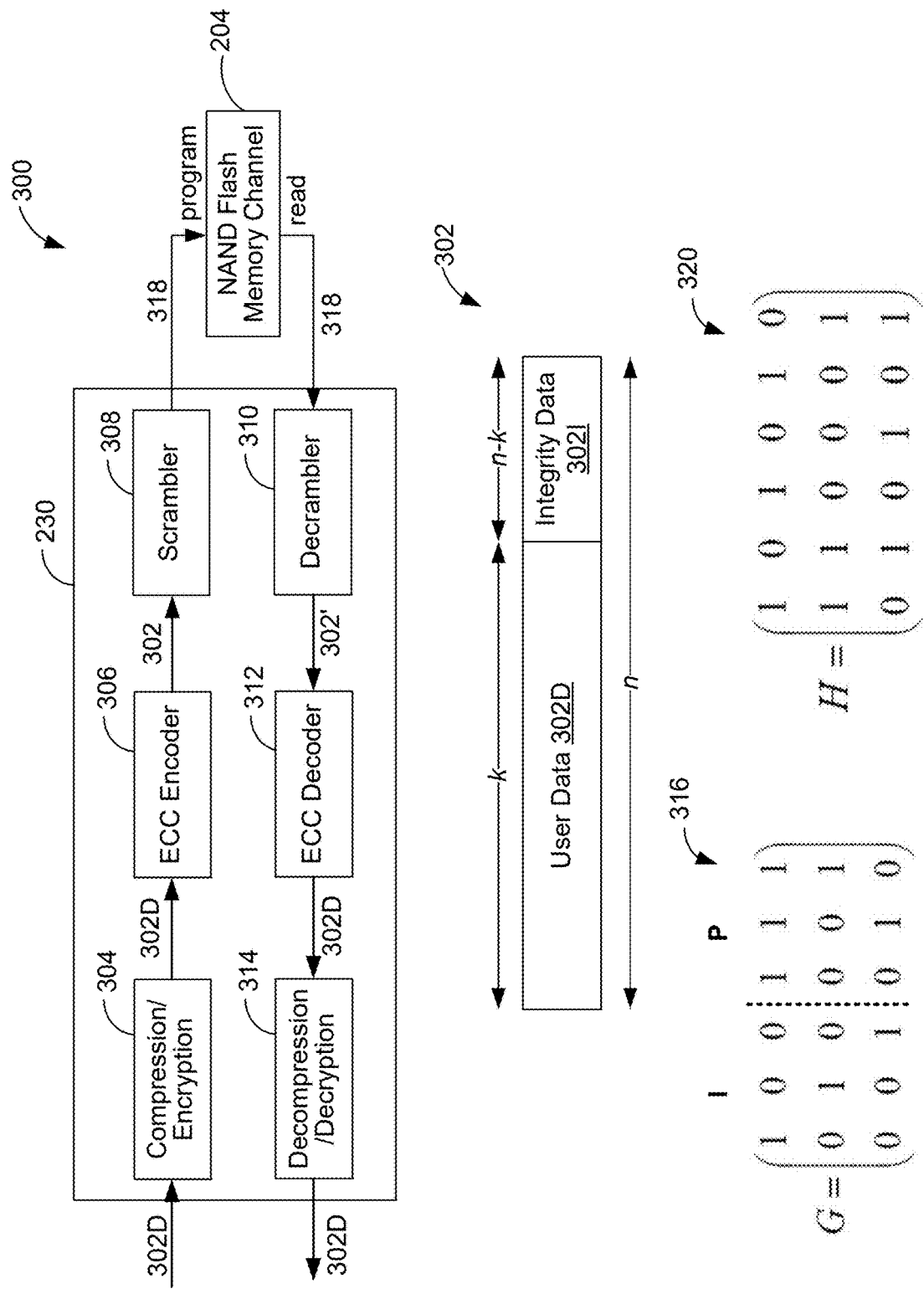
FIG. 3 is a block diagram of an example integrity check system of a memory system for processing a codeword, in accordance with some embodiments.

In some embodiments, data in the plurality of memory channels 204 is grouped into coding blocks, and each coding block is called a codeword (FIG. 3, 302). For example, each codeword includes n bits among which k bits correspond to user data and (n −k) corresponds to integrity data of the user data, where k and n are positive integers. In some embodiments, the memory system 200 includes an integrity engine 230 (e.g., an LDPC engine) and registers 232 including a plurality of registers or SRAM cells or flip-flops and coupled to the integrity engine 230. The integrity engine 230 is coupled to the memory channels 204 via the channel controllers 214 and SRAM buffer 224. Specifically, in some embodiments, the integrity engine 230 has data path connections to the SRAM buffer 224, which is further connected to the channel controllers 214 via data paths that are controlled by the local memory processor 218. The integrity engine 230 is configured to verify data integrity for each coding block of the memory channels 204 using variable nodes and check nodes, and messages are exchanged between the variable and check nodes during the integrity check process. A subset of these messages is selected and temporarily stored in the registers 232 as variable node data or check node data.

Various implementations of this application are directed to compressing check node data that is temporarily stored in the registers 232 during an integrity check process implemented by the memory system 200 (e.g., an SSD). In some embodiments, check node data of a set of check nodes are compressed jointly by the integrity engine 230 to save one or more bits in the registers or register files or SRAM cells or flip-flops, e.g., in a lossless manner. In some embodiments, multiple data items of check node data of a single check node are compressed jointly by the integrity engine 230 to save one or more bits in the registers or register files or SRAM cells or flip-flops, e.g., in a lossless or lossy manner. In some embodiments, a memory space is reconfigured to store check node data for two distinct numbers of check nodes, and a data structure of the check node data is adjusted when the check node data is switched between two distinct numbers of check nodes. By these means, storage space allocated to the registers, register file, SRAM cells, and/or flip-flops is reduced, and storage space of the memory system is utilized efficiently with little or no impact on performance of data integrity check process.

Data Integrity Check Based on Low-Density Parity-Check (LDPC) Codes

FIG. 3 is a block diagram of an example integrity check system 300 of a memory system 200 for processing a codeword 302, in accordance with some embodiments. The integrity check system 300 includes a plurality of memory channels 204, an integrity engine 230 (e.g., an LDPC engine), and registers 232. Data stored in memory channels 204 of the memory system 200 (FIG. 2) is grouped into coding blocks, and each coding block is called a codeword 302. Each codeword 302 further includes n data bits among which k data bits are user data 302D and (n−k) data bits are integrity data 302I of the user data 302D, where k and n are positive integers. The integrity check system 3M) is configured to verify data integrity for each codeword 302 of the memory channels 204 using variable nodes 404 and check nodes 402 (FIG. 4).

In some embodiments, the integrity engine 230 further includes one or more of: a compression module 304, an error correction code (ECC) encoder 306, a scrambler 308, a descrambler 310, an ECC decoder 312, and a decompression module 314. The compression module 304 obtains user data 302D and processes (e.g., compresses, encrypts) the user data 302D. The ECC encoder 306 obtains the user data 302D that is optionally processed by the compression module 304, and applies a parity data generation matrix G (316) on the user data 302D to encode the codeword 302. The matrix G (316) has k rows and n columns. A systematic form of the matrix G includes an identify matrix I configured to preserve the user data 302D within the codeword 302 and a parity matrix P configured to generate the integrity data 302I from the user data 302D. In some embodiments, the matrix G (316) is not unique and includes a set of basis vectors for a vector space of valid codewords 302. The scrambler 308 obtains the codeword 302 including n data bits and converts the n data bits to a scrambled codeword 318 having a seemingly random output string of n data bits. The scrambled codeword 318 is stored in the memory channels 204 of the memory system 200.

During decoding, the scrambled codeword 318 is extracted from the memory channel 204 of the memory system 200. The descrambler 310 recovers a codeword 302' from the scrambled codeword 318, and the ECC decoder 312 verifies whether the recovered codeword 302' is valid and corrects erroneous bits in the recovered codeword 302', thereby providing the valid codeword 302 including the valid user data 302D. In some situations, a bit of the recovered codeword 302' is "1," which is consistent with a corresponding bit of the codeword 302 ("1"). The bit of the recovered codeword 302' is correct. Conversely, in some situations, a bit of the recovered codeword 302' is "1", which does not match a corresponding bit of the codeword 302 ("0"). The bit of the recovered codeword 302' is erroneous. In some situations, a bit of the recovered codeword 302' is "0," which is consistent with a corresponding bit of the codeword 302 ("0"). The bit of the recovered codeword 302' is correct. Conversely, in some situations, a bit of the recovered codeword 302' is "0", which does not match a corresponding bit of the codeword 302 ("1"). The bit of the recovered codeword 302' is erroneous.

In some embodiments, the decompression module 314 obtains the user data 302D and processes (e.g., decompresses, decrypts) the user data 302D. In some embodiments, for integrity check, the ECC decoder 312 applies a parity check matrix H (320) on the recovered codeword 302' to generate a syndrome vector S. The parity check matrix H (320) includes n−k rows corresponding to n−k parity check equations and n columns corresponding to n codeword bits. A relationship of the recovered codeword 302' and the syndrome vector S is represented as follows:

$$S = yH^T \quad (1)$$

where y is the recovered codeword 302'. In some embodiments, in accordance with a determination that the syndrome S is equal to 0, the ECC decoder 312 determines that all parity check equations associated with the parity check matrix H are satisfied and that the recovered codeword 302' is valid. Conversely, in accordance with a determination that the syndrome is not equal to 0, the ECC decoder 312 determines that at least one parity check equation associated with the parity check matrix H is not satisfied and that the recovered codeword 302' is not valid. Alternatively, in some embodiments, the ECC decoder 312 operates to solve the following equation:

$$S = eH^T \quad (2)$$

where e is an error vector. The syndrome vector S is a combination of the error vector e and a valid codeword 302. Given that the syndrome vector S and the parity check matrix H are known, the ECC decoder 312 solves equation (2) to obtain the error vector e and identify the erroneous bits in the recovered codeword 302'.

FIG. 4A is a Tanner graph 400 applied to implement LDPC coding using check nodes 402 and variable nodes 404, in accordance with some embodiments. Data stored in a memory system 200 (FIG. 2) is verified on a codeword basis. Each codeword 302 includes n data bits among which k data bits are user data 302D and n−k data bits are integrity data 302I of the user data 302D, where k and n are positive integers. In some embodiments, the parity check matrix H (320) is applied without differentiating the user data 302D and the integrity data 302I during integrity check. The parity check matrix H (320) includes n−k rows corresponding to n−k parity check equations and n columns corresponding to n codeword bits, where k and n are positive integers. Each parity check equation combines corresponding n codeword bits (also called codeword symbols), and therefore, corresponds to a check node 402 that is connected up to a subset or all of the n variable nodes 404. In some embodiments, only j codeword bits in the n codeword bits correspond to 1 in the parity check matrix H (320) for a row corresponding to check node 402, where j is an integer less than n, and the check node 402 is connected to the j variable nodes 404. In some embodiments, each and every check node 402 is connected to the same number of variable nodes 404 (e.g., j variable nodes 404). Alternatively, in some embodiments, each check node 402 is connected to a respective number of variable nodes 404, and at least two check nodes 402 are connected to different numbers of variable nodes 404.

Referring to FIG. 4A, in this example, the codeword 302 has 10 codeword symbols (also called codeword bits). Five parity check equations are applied to do integrity check on the codeword 302, and each parity check equation is applied on a set of four codeword symbols (j=4). As such, the Tanner graph 400 includes five check nodes 402 ($f_0$-$f_4$) and each check node 402 is connected to four respective variable nodes 404 each corresponding to a distinct set of four codeword symbols of the codeword 302.

In some embodiments, the ECC decoder 312 solves equation (2) to obtain the error vector e and identify one or more erroneous bits in the codeword 302 by an iterative integrity check process. Messages are exchanged between the variable nodes 404 and check nodes 402 on the Tanner graph 400 until the one or more erroneous bits are identified or corrected in the codeword 302. Each variable node 404 is assigned with initial variable node data. In some embodiments, the initial variable node data includes a log-likelihood ratio (LLR) that is determined based on data measured when a read reference voltage is adjusted for the memory system 200. Each check node 402 is connected to a set of variable nodes 404, and receives messages including the initial variable node data from the set of variable nodes 404. For each check node 402, the check node data is determined based on the initial variable node data of the set of variable nodes 404, and indicates a likelihood of a set of codeword symbols corresponding to the set of variable nodes 404 being erroneous. Conversely, each variable node 404 is also connected to a set of check nodes 402 on the Tanner graph 400, and receives messages including the check node data from the set of check nodes 402. For each variable node 404, variable node data is updated based on the check node data 422 of the set of variable nodes 404. By these means, the messages are exchanged between the check nodes 402 and variable nodes 404 until an integrity check requirement is satisfied, and the one or more erroneous bits are identified or corrected based on the variable node data or the check node data. In some embodiments, the integrity check requirement is satisfied when sign 424 is 0 for all check nodes 402.

FIG. 4B is a simplified Tanner graph 420 having a single check node 402 coupled to a set of variable nodes 404, in accordance with some embodiments. Check node 402 receives variable-to-check node message data $v_1$, $v_2$, $v_3$, ... $v_j$ from j variable nodes 404, where j is also known as the degree of the check node, de. After a check node update is performed based on a min-sum algorithm, check node 402 sends check-to-variable node message data $u_1$, $u_2$, $u_3$, ... $u_j$ to $d_c$ variable nodes 404. Details about the check node update calculation for k, where k is an integer in the range [1, $d_c$], are as follows:

$$u_k = \left(\prod_{m=1, m \neq k}^{d_c} \text{sign}(v_m)\right) \times \min_{m \neq k} |v_m| \quad (3)$$

$$\text{sign}(u_k) = \left(\prod_{m=1, m \neq k}^{d_c} \text{sign}(v_m)\right) \quad (4)$$

$$|u_k| = \min_{m \neq k} |v_m| = \begin{cases} \text{Min2 Magnitude}, k = \text{Min1 Index} \\ \text{Min1 Magnitude}, k \neq \text{Min1 Index} \end{cases} \quad (5)$$

where Min1 and Min2 correspond to two variable nodes 404 having the most minimum variable-to-check node message magnitude and the second minimum variable-to-check node message magnitude, respectively. The check node data 422 includes a sign bit 424, a first likelihood data item 426 (Min1 Magnitude), a second likelihood data item 428 (Min2 Magnitude), and a first index data item 430 (Min1 Index). In accordance with equation (4), the sign bit 424 is generated based on signs of the variable-check node message data ($v_1$−$v_m$) from the set of variable nodes 404. Stated another way, the sign bit 424 is a combination of signs of respective likelihood data items of a subset of codeword symbols corresponding to the set of variable nodes 404. The first likelihood data item 426 and the second likelihood data item 428 include magnitudes of the most minimum variable-to-check node message data (Min1) and the second minimum variable-to-check node message data (Min2) of the set of variable nodes 404, respectively. The first index data item 430 identifies one of the sets of variable nodes 424 corresponding to the first likelihood data item 426. In some embodiments, the check node data 422 further includes a second index data item 432 identifying a second one of the sets of variable nodes 424 corresponding to the second likelihood data item 428.

Figure 5A:
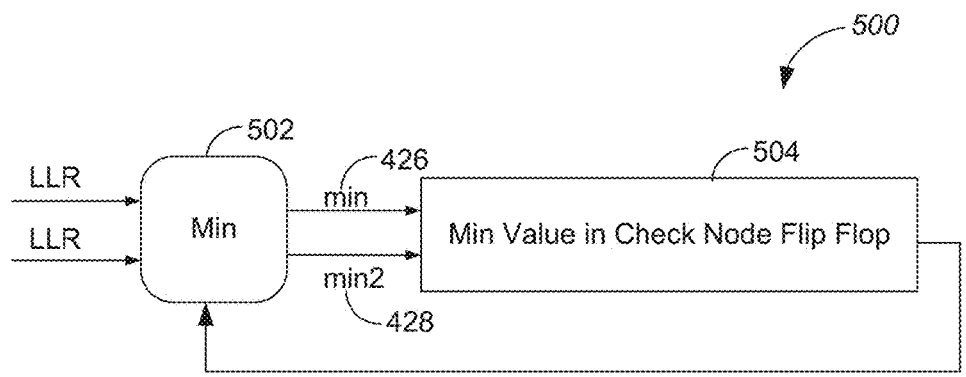
FIG. 5A is a schematic diagram of a sequence of check node operations implemented to determine check node data of a check node during LDPC decoding, in accordance with some embodiments.

FIG. 5A is a schematic diagram of a sequence of check node operations 500 implemented to determine check node data of a check node 402 during LDPC decoding, in accordance with some embodiments. LDPC decoding is performed based on a min-sum method. An integrity engine 230 (FIG. 2) organizes a plurality of arithmetic units and registers 232 to implement an instruction corresponding to the min-sum method without frequently interacting with a local memory processor 218. Specifically, each check node 402 corresponds to a parity check equation that combines corresponding n codeword symbols (also called codeword bits), and is connected to a subset of the n variable nodes 404. In some embodiments, only j codeword symbols in then codeword symbols are associated with non-zero coefficients in the parity check equation, and the check node 402 is connected to the j variable nodes 404. For each check node 402, the plurality of arithmetic units includes a comparator operator 502 coupled to flip-flops 504 in registers 232 (FIG. 2). The comparator operator 502 receives variable-to-check node message data from a subset of the j variable nodes 404 connected to the check node 402, and check node data 422, and determines the first likelihood data item 426 and the second likelihood data item 428, corresponding to the most minimum variable-to-check node message data (Min1) and the second minimum variable-to-check node message data (Min2) of the set of j variable nodes 404, respectively. The first likelihood data item 426 and the second likelihood data item 428 are stored into the flip flops 504 of the registers 232. In some embodiments, the variable-to-check node message data from each of the set of j variable nodes 404 includes an LLR that is determined based on data measured when a read reference voltage is adjusted for the memory system 200.

Figure 5B:
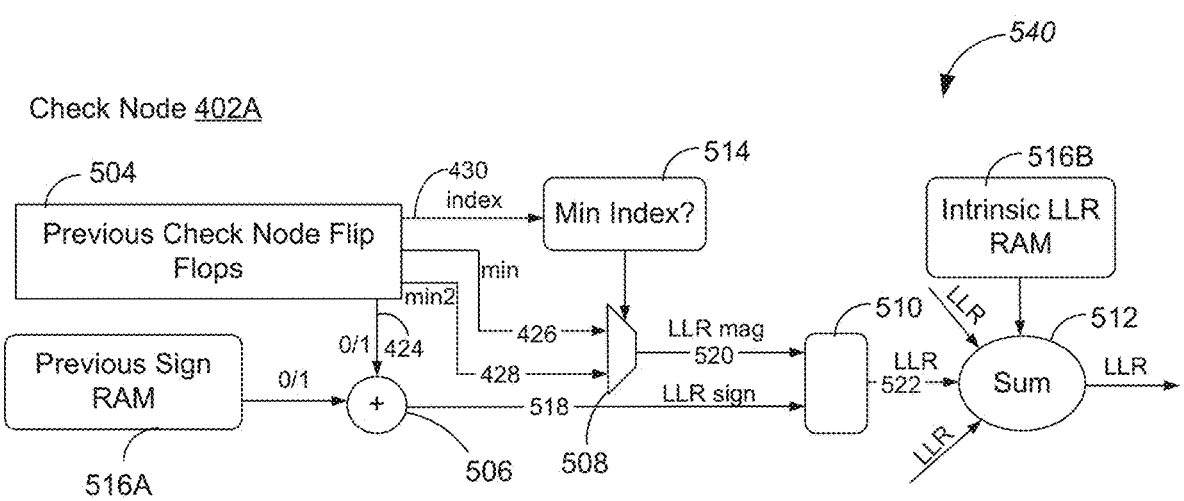
FIG. 5B is a schematic diagram of a sequence of variable node operations implemented to determine variable node data of a variable node during LDPC decoding, in accordance with some embodiments.

FIG. 5B is a schematic diagram of a sequence of check node and variable node operations 540 implemented to determine variable-to-check node message data from a variable node 404 during LDPC decoding, in accordance with some embodiments. For each variable node 404, the plurality of arithmetic units organized by the integrity engine 230 includes a sign operator 506, a multiplexer 508, a combiner 510, a sum operator 512, an index identifier 514, and one or more random access memory (RAM) 516. The RAM 516 stores data involved in the check node and variable node operations 540 temporarily. In some embodiments, the registers 232 further includes the RAM 516 associated with these check node and variable node operations 540. Each variable node 404 is connected to a set of check nodes 402, and applied in a set of parity check equations corresponding to the set of check nodes 402. One of the sets of check nodes 402 corresponds to check node data stored in the flip-flops 504 and including a sign bit 424, a first likelihood data item 426, a second likelihood data item 428, and a first index data item 430. A previous variable-to-check node message data sign stored in a RAM 516A is combined with the sign bit 424 by the sign operator 506 to form an LLR sign 518. The index identifier 514 compares an index k of the variable node 404, which uniquely identifies one variable node 404 among the j variable nodes connected to one check node 402, with the first index data item 430. In accordance with a comparison result, the multiplexer 508 selects one of the likelihood data items 426 and 428 as a likelihood data item 520, and the combiner 510 generates a signed LLR data item 522 that is sent from check node 402 to variable node 404 based on the LLR sign 518 and likelihood data item 520. Specifically, in some embodiments, in accordance with a determination that the index k of the variable node 404 is equal to the first index data item 430, the multiplexer 508 selects the second likelihood data item 428 as the likelihood data item 520. Conversely, in some embodiments, in accordance with a determination that the index k of the variable node 404 is not equal to the first index data item 430, the multiplexer 508 selects the first likelihood data item 426 as the likelihood data item 520.

The sum operator 512 combines intrinsic LLR data stored in the RAM 516B and LLR data items 522 for the set of check nodes 402 to update the variable node data associated with the variable node 404. In some embodiments, the intrinsic LLR data corresponds to initial variable node data of each variable node 404 associated with a respective codeword symbol of a codeword 302. The intrinsic LLR data is determined based on a log-likelihood ratio (LLR) that is approximated as follows:

$$LLR(y) = \ln\frac{p(x=0 \mid y)}{p(x=1 \mid y)} = \ln\frac{p(y \mid x=0)}{p(y \mid x=1)} \quad (6)$$

where p(|) is a probability of a combination of data values, x is a value stored for the respective codeword symbol, and y is a correct value of the respective codeword symbol. The intrinsic LLR data is determined based on data measured when a read reference voltage is adjusted for the memory system 200.

During LDPC decoding, the integrity engine 230 relies on the registers 232 including an array of registers to temporarily store check node data associated with each check node 402. The more the check nodes 402, the larger the registers 232. The larger a size of the check node data of each check node 402, the larger the registers 232. The registers 232 operates at a high speed and allows the integrity engine 230 or local memory processor 218 to access and manipulate data stored in the registers 232 directly within one or more clock cycles. The registers 232 is expensive in price. For these reasons, it would be beneficial to compress check node data generated and temporarily stored during an integrity check process (e.g., LDPC decoding), thereby reducing expensive register usage and enhancing memory access performance.

Joint Compression of Check Node Data of Multiple Check Nodes

Figure 6:
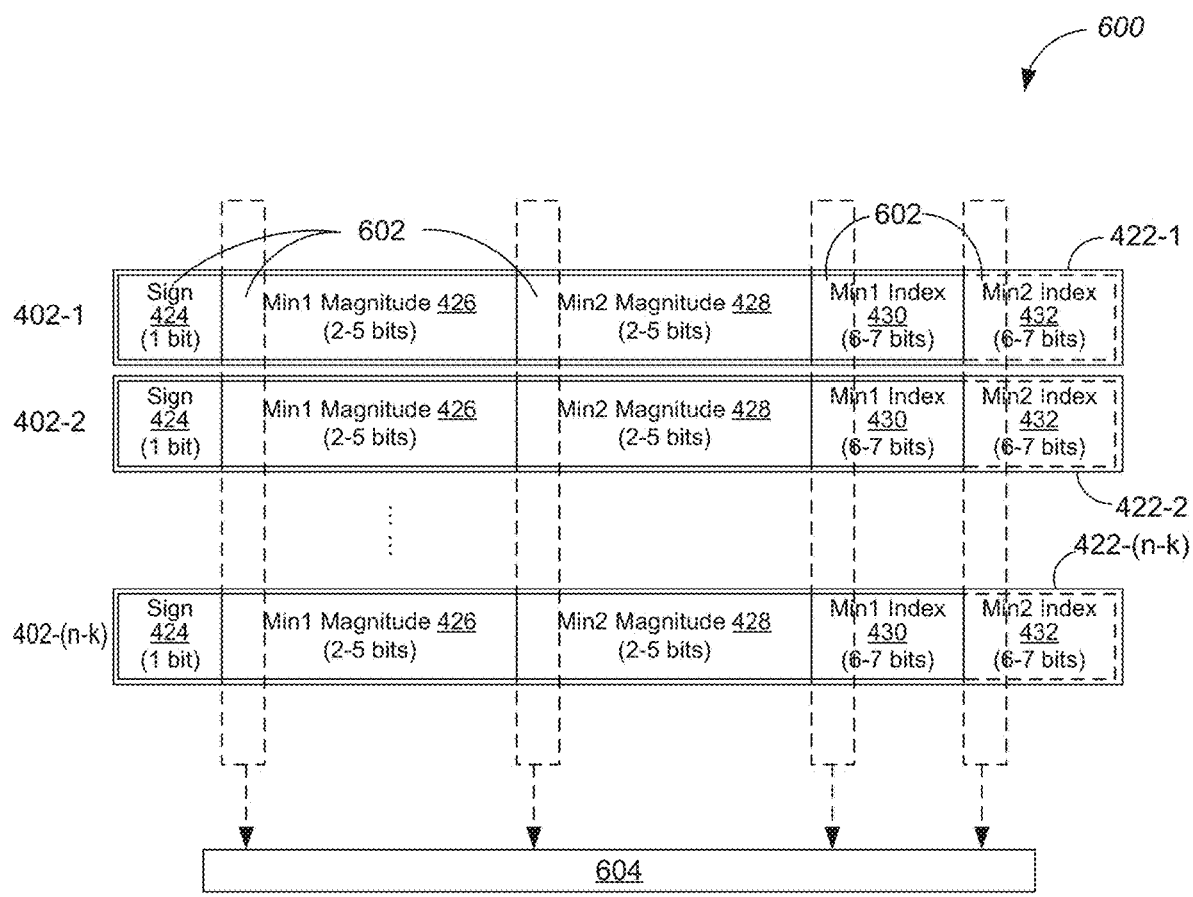
FIG. 6 is an example data structure of check node data of a set of check nodes having one or more data compression schemes, in accordance with some embodiments.

FIG. 6 illustrates an example data structure 600 of check node data of a set of check nodes 402 having one or more data compression schemes, in accordance with some embodiments. Data stored in a memory system 200 is verified on a codeword basis. Each codeword 302 includes n data bits among which k data bits are user data 302D and n–k data bits are integrity data 302I generated based on the user data 302D, where k and n are positive integers. The codeword 302 is validated using n–k parity check equations. Each parity check equation combines j distinct codeword bits of the total n codeword bits, and therefore, corresponds to a check node 402 that is coupled to j distinct variable nodes of n variable nodes 404. In some embodiments, the set of check nodes 402 includes a plurality of check nodes 402 associated with a block of data stored in the memory system 200. Each check node 402 corresponds to a subset of codeword symbols (e.g., j codeword bits) in the block of data and has respective check node data 422 indicating a likelihood of the subset of codeword symbols being erroneous.

In an example, the block of data corresponds to n–k parity check equations and n–k check nodes 402-1, 402-2, . . . , and 402-n–k. The integrity engine 230 creates check node data 422-1, 422-2, . . . , and 422-n–k. For each check node, the respective check node data 422 includes one or more data items, e.g., a sign bit 424, a first likelihood data item 426, a second likelihood data item 428, and a first index data item 430 as determined based on a min-sum method (in equations (3)-(5)). Each data item of the check node data 422 has a respective number of bits. For example, for each check node 402, the sign bit 424 has 1 bit. The first likelihood data item 426 has 2-5 bits, so is the second likelihood data item 428. The first index data item 430 has 6-7 bits, so is the second index data item 432 (if any). Each of the one or more data items has one or more respective most significant bits (MSBs). For example, the sign bit 424 has at most one MSB. Each of the likelihood data items 426 and 428 has one or more respective MSBs, e.g., 1 MSB, 2 MSBs, 3 MSBs. Each index data item 430 or 432 has one or more respective MSBs, e.g., 1 MSB, 2 MSBs, 3 MSBs.

The n–k check nodes 402-1, 402-2, . . . , and 402-n–k include a subset of check nodes (e.g., two or more check nodes 402) corresponding to a subset of check node data that is compressed and stored jointly in a memory block (e.g., registers 232 in FIG. 2. Specifically, each of the subset of check nodes 402 has a set of most significant bits (MSBs) 602 of one or more data items in the respective check node data 422. A plurality of MSB sets 602 of the subset of check nodes 402 are compressed to a set of data bits 604, and each MSB set 602 includes the set of MSBs 602 of the one or more data items in the respective check node data 422 of each of the subset of check nodes 402. The plurality of MSB sets 602 has a first number of bits in total, and the set of data bits 604 has a second number of bits. The first number is greater than the second number. In an example, each of 3 check nodes has 1 MSB of each of the likelihood data items 426 and 428, and total 6 MSBs of the 3 check nodes are compressed jointly to a set of 5 data bits 604. As the set of data bits 604 is stored in place of the plurality of MSB sets 602 of the subset of check nodes 402, at least one data bit is saved for the memory block allocated to store the check node data of the n–k check nodes 402.

Figure 7A:
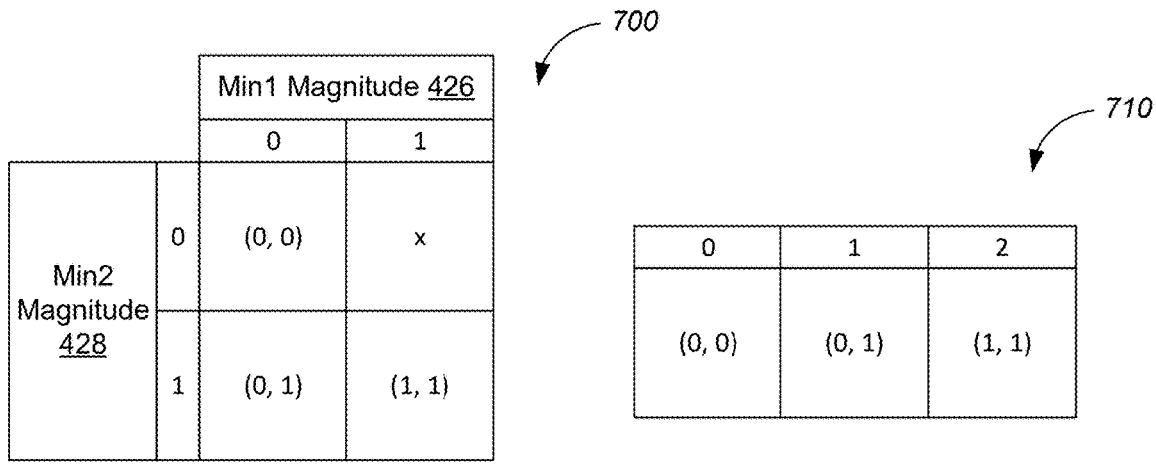
FIG. 7A illustrates two tables showing possible combinations of two data items of check node data of each check node, in accordance with some embodiments.
Figure 7B:
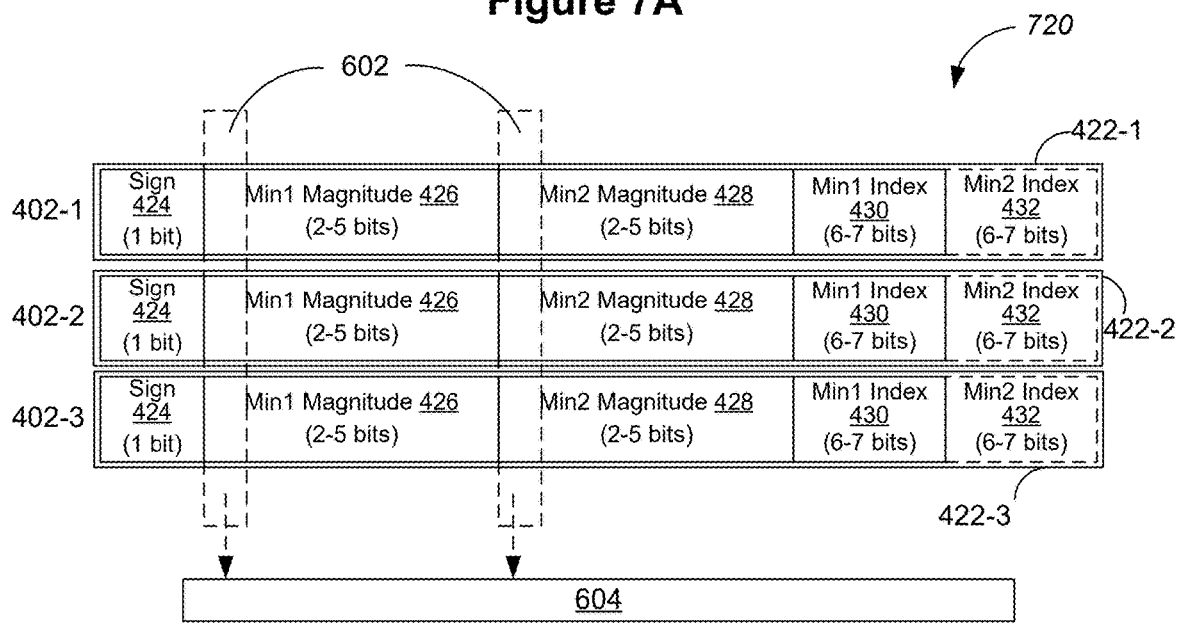
FIG. 7B is an example data structure of check node data of a subset of check nodes that are compressed based on the tables shown in FIG. 7A, in accordance with some embodiments, and FIG. 7C compares original check node data of a subset of check nodes with corresponding check node data that are compressed, in accordance with some embodiments.
Figure 7C:
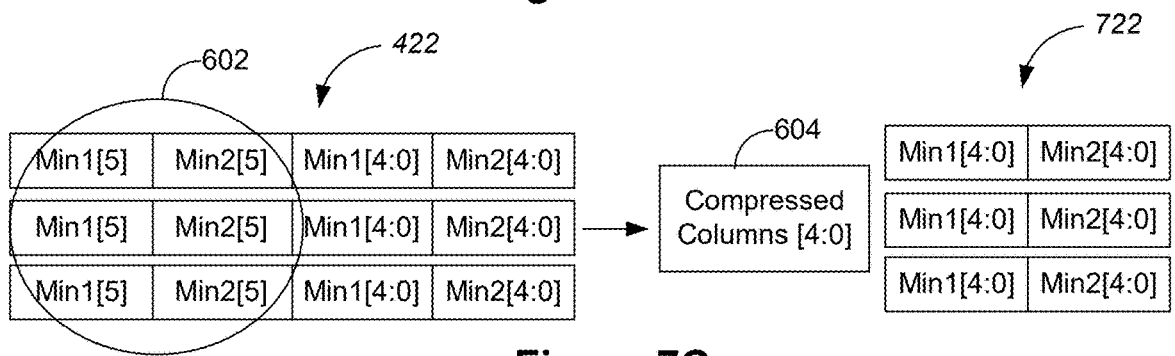

FIG. 7A illustrates two tables 700 and 710 showing possible combinations of two data items 426 and 428 of check node data 422 of each check node 402, in accordance with some embodiments. FIG. 7B illustrates an example data structure 720 of check node data 422 of a subset of check nodes 402 that are compressed based on the tables shown in FIG. 7A, in accordance with some embodiments, and FIG. 7C compares original check node data 422 of a subset of 3 check nodes 402 with corresponding check node data 722 that are compressed, in accordance with some embodiments.

For each check node 402, a first likelihood data item 426 and a second likelihood data item 428 are applied in min-sum based LDPC decoding, and each likelihood data item 426 or 428 has an MSB. Referring to FIG. 7A, the first likelihood data item 426 is less than or equal to the second likelihood data item 428, and it never happens that the MSB of the first likelihood data item 426 is equal to 1 while the MSB of the second likelihood data item 428 is equal to 0. A combination of the two MSBs of the likelihood data items 426 and 428 is never equal to (1, 0), and only three combinations of the two MSBs of the likelihood data items 426 and 428 (e.g., (0, 0), (0, 1), and (1, 1)) are possible. Referring to FIG. 7B, in some embodiments, the subset of check nodes 402 includes 3 check nodes 402. The first likelihood data item 426 and the second likelihood data item 428 of three check nodes 402 are compressed jointly. Each likelihood data item 426 or 408 has one MSB 602, and 3 check nodes 402 have 6 MSBs 602 in total. These 6 MSBs 602 correspond to 27 (i.e., 3×3×3) combinations of values, which are representable by a set of 5 data bits 604. As such, 6 MSBs 602 of the likelihood data items 426 and 428 of 3 check nodes 402 are compressed and stored jointly in the set of 5 data bits 604, thereby saving 1 data bit for space of the registers 232 every 3 check nodes 402 (i.e., ⅓ bit for each check node 402 on average).

Referring to FIG. 7B, in some embodiments, for each of the subset of check nodes 402, the respective check node data 422-1, 422-2, or 422-3 includes a first likelihood data item 426 corresponding to a first codeword symbol and a second likelihood data item 428 corresponding to a second codeword symbol. The one or more data items of each check node 402 include the first likelihood data item 426 and the second likelihood data item 428, and the set of MSBs 602 includes a third number of MSBs (e.g., 1 MSB) of the first likelihood data item 426 and a fourth number of MSBs (e.g., 1 MSB) of the second likelihood data item 428. The plurality of MSB sets 602 has a first number of bits (e.g., 6) in total, and the set of data bits 604 has a second number (e.g., 5) of bits. The first number is greater than the second number, e.g., by 1, 2, or another positive integer.

For each of the subset of check nodes 402, the set of MSBs 602 has 3 value combinations of MSBs, e.g., (0, 0), (0, 1), and (1, 1) in FIG. 7A, of the first and second likelihood data items 426 and 428. In an example, the subset of check nodes 402 includes 3 or 4 check nodes. The first number is greater than the second number by 1. On average, each check node 402 saves ⅓ or ¼ bit memory space. In another example, the subset of check nodes 402 includes 5, 6, or 7 check nodes. The first number is greater than the second number by 2. On average, each check node 402 saves ⅖, ⅓, or 2/7 bit memory space.

Referring to FIG. 7C, in some embodiments, the subset of check nodes 402 includes 3 check nodes. For each of the subset of check nodes 402, each of the first and second likelihood data items 426 and 428 has 6 bits. The first and second likelihood data items 426 and 428 of the original check node data 422 of the subset of check nodes 402 has 36 bits in total. Each of the first and second likelihood data items 426 and 428 has only 1 MSB, and 6 MSBs of the first and second likelihood data items 426 and 428 of the check node data 422 are compressed to 5 MSBs, i.e., "Compressed Columns [4:0]." The first and second likelihood data items 426 and 428 of the compressed check node data 722 of the subset of check nodes 402 have 35 bits in total. Thus, the compressed check node data 722 saves one bit compared with the original check node data 422 of the subset of 3 check nodes 402.

In some embodiments, the integrity engine 230 is configured to compress the check node data 422 of the subset of check nodes 402 using the following logic that is optionally loaded in the registers 232:

```
x[3:0] = column1[1:0] + column2[1:0] * 3 (use lookup table or logic)
If (x[3] == 0)
    compressed_columns [4:0] = {column3[1:0], x[2:0]}
else
    compressed_columns [4:0] = {2'b11, x[2], column3[1:0]}
```

In some embodiments, the integrity engine 230 is configured to decode the compressed check node data 422 of the subset of check nodes 402 using the following logic that is optionally loaded in the registers 232:

```
If (compressed_columns [4:3] <3)
    x[2:0] = compressed_columns [2:0]
    column1[1:0] = x[2:0] % 3
    column2[1:0] = x[2:0] / 3
    column3[1:0] = compressed_columns [4:0]
else
    x[3:0] = 8
    column1[1:0] = 2
    column2[1:0] = 2
    column3[1:0] = compressed_columns [1:0]
```

In some embodiments, the integrity engine 230 saves ⅓ bit storage space in the registers 232 for each check node 402, while adding data compression and data decompression logic. As such, compression MSBs of the subset of check nodes helps conserve expensive register space, resulting in a net gate count reduction in the integrity check system 300.

Figure 8A:
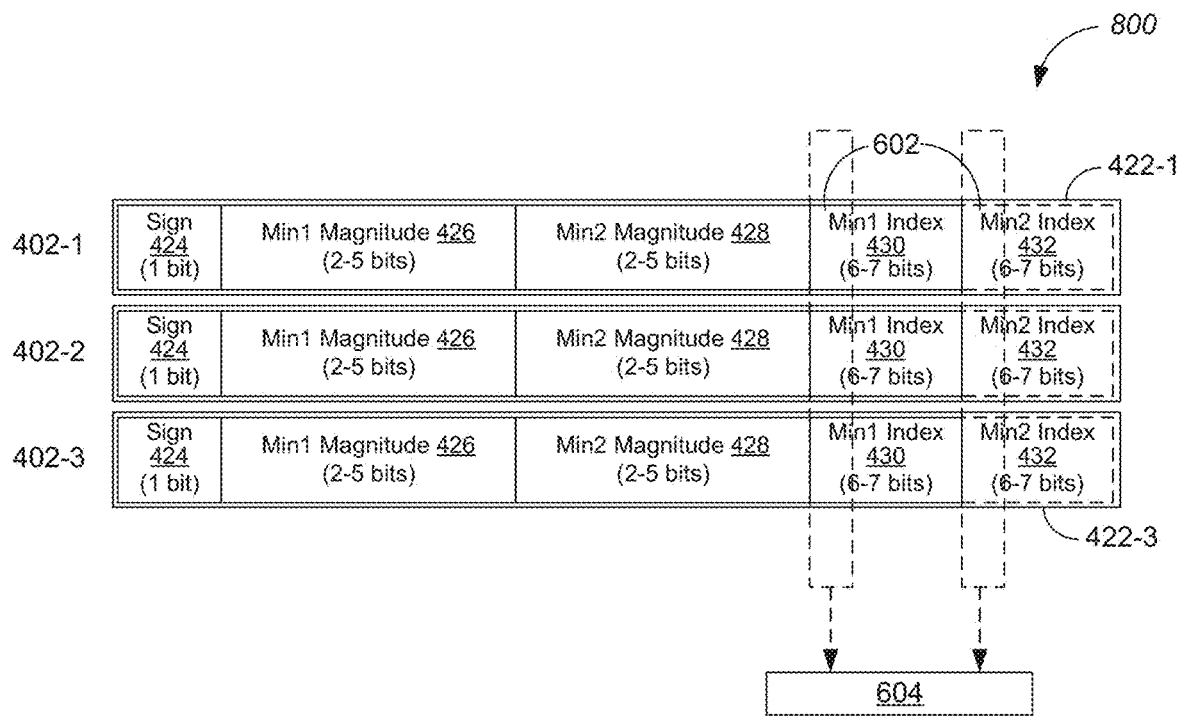
FIG. 8A is another example data structure of check node data of a subset of check nodes having an index-based compression scheme, in accordance with some embodiments, and FIG. 8B compares check node data of a subset of check nodes with corresponding check node data that are compressed, in accordance with some embodiments.
Figure 8B:
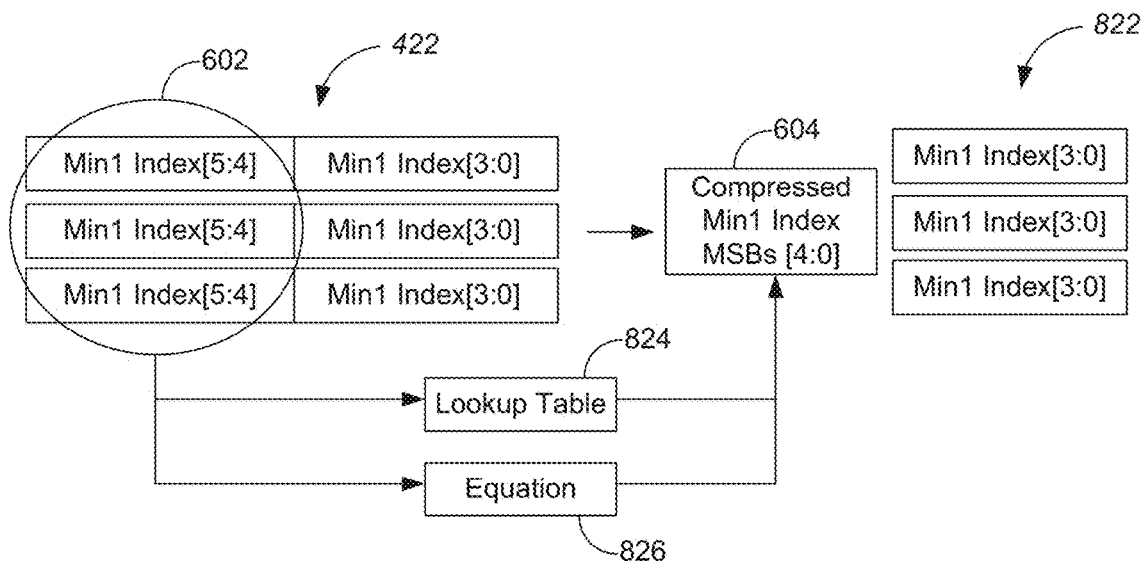

FIG. 8A illustrates another example data structure 800 of check node data 422 of a subset of 3 check nodes 402 having an index-based compression scheme, in accordance with some embodiments, and FIG. 8B compares check node data 422 of a subset of 3 check nodes 402 with corresponding check node data 822 that are compressed, in accordance with some embodiments. For each of the subset of check nodes 402 (e.g., 402-1, 402-2, or 402-3), the respective check node data 422 (e.g., 422-1, 422-2, or 422-3) includes a first likelihood data item 426 and an index data item 430 identifying one of the subsets of codeword symbols corresponding to the first likelihood data item 426. For example, a check node 402 is connected to 6 variable nodes 404 on a Tanner graph 400, and the index data item 430 identifies that the third variable node has the smallest magnitude among the 6 variable nodes 404. For each check node 402-1, 402-2, 402-3, a set of MSBs 602 (e.g., 2 MSBs) of the index data item 430 is identified in the respective check node data 422-1, 422-2, or 422-3. A set of data bits 604 is determined based on a plurality of MSB sets 602 of the index data items 430 of the subset of check nodes 402. The plurality of MSB sets 602 includes the set of MSBs 602 of the index data item 430 in the respective check node data 422 of each of the subset of check nodes 402. The set of data bits 604 is stored in association with the subset of check nodes 402 in a memory block (e.g., the registers 232 including an array of registers) allocated to the plurality of check nodes 402. The plurality of MSB sets 602 has a first number of bits in total, and the set of data bits 604 has a second number of bits. The first number is greater than the second number.

Alternatively, in some embodiments, one or more data items of the check node data 422 that are compressed include the index data item 432 corresponding to a second likelihood data item 428. For example, a check node 402 is connected to 6 variable nodes 404 on a Tanner graph 400, and the index data item 432 identifies that the fifth variable node has the second smallest magnitude among the 6 variable nodes 404. The set of data bits 604 is determined based on a plurality of MSB sets 602 of the index data items 430 of the subset of check nodes 402. The plurality of MSB sets 602 includes the set of MSBs 602 of the index data item 430 in the respective check node data 422 of each of the subset of check nodes 402. At least one bit is saved from compressing the set of MSBs 602 of the index data item 430. Additionally and alternatively, in some embodiments, both of the sets of MSBs 602 of the index data items 430 and 432 are compressed. The set of data bits 604 is determined based on a plurality of MSB sets 602 of both of the index data items 430 and 432 of the subset of check nodes 402. The plurality of MSB sets 602 includes the set of MSBs 602 of the index data items 430 and 432 in the respective check node data 422 of each of the subset of check nodes 402. At least one bit is saved from compressing the set of MSBs 602 of the index data items 430 and 432.

Referring to FIG. 8B, in some embodiments, the subset of check nodes 402 includes 3 check nodes. For each of the subset of check nodes 402, the first index data item 430 has 6 bits. The first index data items 430 of the original check node data 422 of the subset of check nodes 402 has 18 bits in total. Each first index data item 430 has 2 MSBs, and 6 MSBs of the first index data items 430 of the check node data 422 are compressed to a set of 5 MSBs, i.e., "Compressed Min1 Index MSBs [4:0]". The set of 5 data bits are stored jointly with a plurality of remaining bit sets (e.g., "Min 1 Index[3:0]") of the subset of check nodes 402. The first index data items 430 of the compressed check node data 822 of the subset of check nodes 402 has 17 bits in total. Thus, the compressed check node data 822 saves one bit compared with the original check node data 422 of the subset of 3 check nodes 402.

In some embodiments, the set of data bits 604 is determined based on the plurality of MSB sets 602 by identifying a lookup table 824. A combination of the plurality of MSB sets 604 of the subset of check nodes 402 is identified in the lookup table 824. The lookup table 824 is checked to determine the set of data bits 604 based on the combination of the plurality of MSB sets. Alternatively, in some embodiments, the set of data bits 604 is determined based on the plurality of MSB sets 602 by identifying a predefined equation 826. A plurality of input values is determined based on the plurality of MSB sets 602 of the subset of check nodes 402. An output value is determined based on the predefined equation 826 and the plurality of input values, and converted to the set of data bits 604. The set of data bits 604 is uniquely determined based on the plurality of MSB sets 602 in the lookup table 824 or equation 826.

In some embodiments, the integrity engine 230 is configured to compress the check node data 422 of the subset of check nodes 402 using the following logic that is optionally loaded in the registers 232:

```
x[3:0] = min_index_msb1[1:0] + min_index_msb2[1:0] * 3
If (x[3] == 0)
    compressed_min_index_msbs [4:0] = {min_index_msb3[1:0], x[2:0]}
else
    compressed_min_index_msbs [4:0] = {2'b11, x[2], min_index_msb3[1:0]}
```

In some embodiments, the integrity engine 230 is configured to decode the compressed check node data 422 of the subset of check nodes 402 using the following logic that is optionally loaded in the registers 232:

```
If (compressed_min_index_msbs [4:3] < 3)
    x[2:0] = compressed_min_index_msbs [2:0]
    min_index_msb1[1:0] = x[2:0] % 3
    min_index_msb2[1:0] = x[2:0] / 3
    min_index_msb3[1:0] = compressed_min_index_msbs [4:0]
else
    x[3:0] = 8
    min_index_msb1[1:0] = 2
    min_index_msb2[1:0] = 2
    min_index_msb3[1:0] = compressed_min_index_msbs [1:0]
```

In some embodiments, the integrity engine 230 saves ⅓ bit storage space in the registers 232 for each check node 402, while adding data compression and data decompression logic. As such, compression MSBs of the subset of check nodes helps conserve expensive register space, resulting in a net gate count reduction in the integrity check system 300.

FIG. 9 is a flow diagram of a method 900 for compressing check node data 422 for an electronic device, in accordance with some embodiments. The method 900 is implemented at an electronic device including the memory system 200 (FIG. 2). At step 902, the electronic device identifies a plurality of check nodes 402 associated with a block of data. At step 904, each check node corresponds to a subset of codeword symbols in the block of data and has respective check node data 422 that indicates a likelihood of the subset of codeword symbols being erroneous. At step 906, for each of a subset of check nodes 402, the electronic device identifies a set of most significant bits (MSBs) 602 (FIG. 6) of one or more data items (e.g., likelihood data items 426 and 428) in the respective check node data 422. At step 908, the electronic device determines a set of data bits 604 (FIG. 6) based on a plurality of MSB sets 602 of the subset of check nodes 402. At step 910, the plurality of MSB sets 602 includes the set of MSBs 602 of the one or more data items in the respective check node data 422 of each of the subset of check nodes 402. At step 912, the electronic device stores the set of data bits 604 in association with the subset of check nodes 402 in a memory block (e.g., registers 232) allocated to the plurality of check nodes 402. At step 914, the plurality of MSB sets 602 has a first number of bits in total, and the set of data bits 604 has a second number of bits. The first number is greater than the second number.

In some embodiments, for each of the subset of check nodes 402, the respective check node data 422 includes a first likelihood data item 426 and an index data item 430 identifying one of the subsets of codeword symbols corresponding to the first likelihood data item 426, and the one or more data items include the index data item 430. In some embodiments, the subset of check nodes 402 includes 3 check nodes 402, and for each of the subset of check nodes 402, the set of MSBs 604 of the one or more data items in the respective check node data 422 includes 2 MSBs of the index data item 430.

In some embodiments, for each of the subset of check nodes 402, the respective check node data 422 includes a first likelihood data item 426 corresponding to a first codeword symbol and a second likelihood data item 428 corresponding to a second codeword symbol. The one or more data items include the first likelihood data item 426 and the second likelihood data item 428, and the set of MSBs 604 includes a third number of MSBs of the first likelihood data item 426 and a fourth number of MSBs of the second likelihood data item 428. Further, in some embodiments, the first likelihood data item 426 is less than or equal to the second likelihood data item, and the third number and the fourth number are equal to 1. Additionally, in some embodiments, the subset of check nodes 402 includes 3 check nodes 402, the plurality of MSB sets of the subset of check nodes 402 includes 6 bits in total. For each of the subset of check nodes 402, the set of MSBs has 3 value combinations of MSBs of the first and second likelihood data items 426 and 428. The plurality of MSB sets of the subset of check nodes 402 has 3×3×3 value combinations of MSBs of the first and second likelihood data items 426 and 428, and the set of data bits 604 has 5 bits for representing the 3×3×3 value combinations. The first number is greater than the second number by 1. In some embodiments, the subset of check nodes 402 includes 5, 6, or 7 check nodes 402; for each of the subset of check nodes 402, the set of MSBs has 3 value combinations of MSBs of the first and second likelihood data items; and the first number is greater than the second number by 2.

In some embodiments, determining the set of data bits 604 based on the plurality of MSB sets further comprises: identifying a lookup table; identifying a combination of the plurality of MSB sets of the subset of check nodes 402 in the lookup table; and checking the lookup table to determine the set of data bits 604 based on the combination of the plurality of MSB sets.

In some embodiments, determining the set of data bits 604 based on the plurality of MSB sets further comprises: identifying a predefined equation; determining a plurality of input values based on the plurality of MSB sets of the subset of check nodes 402; determining an output value based on the predefined equation and the plurality of input values; and determining the set of data bits 604 from the output value.

In some embodiments, storing the set of data bits 604 in association with the subset of check nodes 402 further comprising: storing the set of data bits 604 and a plurality of remaining bit sets of the subset of check nodes 402 jointly, the plurality of remaining bit sets including a set of remaining bits of the one or more data items in the check node data 422 of each of the subset of check nodes 402.

In some embodiments, for each check node 402, the subset of codeword symbols corresponds to a set of likelihood data items. Each likelihood data item indicates a likelihood of a respective codeword symbol being erroneous. The electronic device identifies a first likelihood data item 426 and a second likelihood data item 428, in accordance with a determination that the second likelihood data item 428 is greater than or equal to the first likelihood data item 426 and less than or equal to remaining likelihood data items of the subset of codeword symbols. Further, in some embodiments, each likelihood data item of the respective codeword symbol is determined based on a log-likelihood ratio (LLR) that is approximated by equation (6).

In some embodiments, for each check node, the check node data 422 of the check node 402 further includes a first index data item 430 identifying one of the subsets of codeword symbols corresponding to a first likelihood data item 426 of the check node data 422.

In some embodiments, each of the subset of codeword symbols corresponds to a respective likelihood data item indicating a likelihood of the respective codeword symbol being erroneous, and the check node data 422 of the check node 402 further includes a sign bit 424 that is a combination of signs of respective likelihood data items of the subset of codeword symbols.

Memory is also used to store instructions and data associated with the method 900, and includes high-speed random access memory, such as DRAM, SRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory, optionally, includes one or more storage devices remotely located from one or more processing units. Memory, or alternatively the non-volatile memory within memory, includes a non-transitory computer readable storage medium. In some embodiments, memory, or the non-transitory computer readable storage medium of memory, stores the programs, modules, and data structures, or a subset or superset for implementing method 900.

Some implementations of this application are directed to compressing check node data in an electronic device. The electronic device identifies check nodes associated with a block of data. Each check node corresponds to a subset of codeword symbols in the block of data and has respective check node data indicating a likelihood of the codeword symbols being erroneous. For each of a subset of check nodes, a set of most significant bits (MSBs) is identified in the respective check node data. The electronic device determines a set of data bits based on MSB sets of the subset of check nodes including the set of MSBs identified for each of the subset of check nodes. The set of data bits is stored with the subset of check nodes in a memory block allocated to the check nodes. The MSB sets have a larger number of bits in total than the set of data bits. More specifically, some implementations of this application are described in the following clauses:

Clause 1. A method implemented at an electronic device for compressing check node data, the method comprising: identifying a plurality of check nodes associated with a block of data, each check node corresponding to a subset of codeword symbols in the block of data and having respective check node data that indicates a likelihood of the subset of codeword symbols being erroneous; for each of a subset of check nodes, identifying a set of most significant bits (MSBs) of one or more data items in the respective check node data; determining a set of data bits based on a plurality of MSB sets of the subset of check nodes, the plurality of MSB sets including the set of MSBs of the one or more data items in the respective check node data of each of the subset of check nodes; and storing the set of data bits in association with the subset of check nodes in a memory block allocated to the plurality of check nodes; wherein the plurality of MSB sets has a first number of bits in total, and the set of data bits has a second number of bits, the first number being greater than the second number. s Clause 2. The method of clause 1, wherein for each of the subset of check nodes, the respective check node data includes a first likelihood data item and an index data item identifying one of the subsets of codeword symbols corresponding to the first likelihood data item, and the one or more data items include the index data item.

Clause 3. The method of clause 1 or 2, wherein the subset of check nodes includes 3 check nodes, and for each of the subset of check nodes, the set of MSBs of the one or more data items in the respective check node data includes 2 MSBs of the index data item.

Clause 4. The method of any of clauses 1-3, wherein for each of the subset of check nodes: the respective check node data includes a first likelihood data item corresponding to a first codeword symbol and a second likelihood data item corresponding to a second codeword symbol; the one or more data items include the first likelihood data item and the second likelihood data item, and the set of MSBs includes a third number of MSBs of the first likelihood data item and a fourth number of MSBs of the second likelihood data item.

Clause 5. The method of clause 4, wherein the first likelihood data item is less than or equal to the second likelihood data item, and the third number and the fourth number are equal to 1.

Clause 6. The method of clause 5, wherein: the subset of check nodes includes 3 check nodes, the plurality of MSB sets of the subset of check nodes includes 6 bits in total; for each of the subset of check nodes, the set of MSBs has 3 value combinations of MSBs of the first and second likelihood data items; and the plurality of MSB sets of the subset of check nodes has 3×3×3 value combinations of MSBs of the first and second likelihood data items, and the set of data bits has 5 bits for representing the 3×3×3 value combinations; and the first number is greater than the second number by 1.

Clause 7. The method of clause 5 or 6, wherein: the subset of check nodes includes 5, 6, or 7 check nodes; for each of the subset of check nodes, the set of MSBs has 3 value combinations of MSBs of the first and second likelihood data items; and the first number is greater than the second number by 2.

Clause 8. The method of any of clauses 1-7, wherein determining the set of data bits based on the plurality of MSB sets further comprises: identifying a lookup table; identifying a combination of the plurality of MSB sets of the subset of check nodes in the lookup table; and checking the lookup table to determine the set of data bits based on the combination of the plurality of MSB sets.

Clause 9. The method of any of clauses 1-8, wherein determining the set of data bits based on the plurality of MSB sets further comprises: identifying a predefined equation; determining a plurality of input values based on the plurality of MSB sets of the subset of check nodes; determining an output value based on the predefined equation and the plurality of input values; and determining the set of data bits from the output value.

Clause 10. The method of any of clauses 1-9, storing the set of data bits in association with the subset of check nodes further comprising: storing the set of data bits and a plurality of remaining bit sets of the subset of check nodes jointly, the plurality of remaining bit sets including a set of remaining bits of the one or more data items in the check node data of each of the subset of check nodes.

Clause 11. The method of any of clauses 1-10, wherein for each check node, the subset of codeword symbols corresponds to a set of likelihood data items, each likelihood data item indicating a likelihood of a respective codeword symbol being erroneous, and wherein the method further comprises: identifying a first likelihood data item and a second likelihood data item, in accordance with a determination that the second likelihood data item is greater than or equal to the first likelihood data item and less than or equal to remaining likelihood data items of the subset of codeword symbols.

Clause 12. The method of clause 11, wherein each likelihood data item of the respective codeword symbol is determined based on a log-likelihood ratio (LLR) that is approximated as follows:

$$LLR(y) = \ln\frac{p(x=0\mid y)}{p(x=1\mid y)} = \ln\frac{p(y\mid x=0)}{p(y\mid x=1)}$$

where p(|) is a probability of a combination of data values, x is a value stored for the respective codeword symbol, and y is a correct value of the respective codeword symbol.

Clause 13. The method of any of clauses 1-12, wherein for each check node, the check node data of the check node further includes a first index data item identifying one of the subsets of codeword symbols corresponding to a first likelihood data item of the check node data.

Clause 14. The method of any of clauses 1-13, wherein each of the subset of codeword symbols corresponds to a respective likelihood data item indicating a likelihood of the respective codeword symbol being erroneous, and wherein the check node data of the check node further includes a sign bit that is a combination of signs of respective likelihood data items of the subset of codeword symbols.

Clause 15. An electronic device, comprising: one or more processors; and memory having instructions stored thereon, which when executed by the one or more processors cause the processors to perform a method of any of clauses 1-14.

Clause 16. A non-transitory computer-readable storage medium, having instructions stored thereon, which when executed by one or more processors cause the processors to perform a method of any of clauses 1-14.

Compression of Multiple Data Items of Check Node Data for Each Check Node

FIG. 10 is a data map 1000 illustrating example value combinations of two likelihood data items 426 and 428 of check node data 422 of each check node 402, in accordance with some embodiments. The check node 402 corresponds to a subset of codeword symbols (e.g., 50 codeword bits) in a block of data. The check node data 422 includes a plurality of data items (e.g., likelihood data items 426 and 428), and indicates a likelihood of the subset of codeword symbols being erroneous. A set of data bits 1002 are determined based on a value combination of the plurality of data items to uniquely identify the value combination among a set of selected value combinations 1006 according to a predefined relationship. The set of data bits 1002 is stored in a memory block (e.g., registers 232) to represent the plurality of data items of the check node data 422 of the check node 402. Each of the plurality of data items requires at least a first number of data bits to represent all possible values of the respective data item, and the set of data bits 1002 has a second number of data bits, which is smaller than a sum of the first number of each of the plurality of data items. By these means, at least one bit register space is saved by storing the set of data bits 1002 in place of the plurality of data items of the check node 402.

In some embodiments, for each check node 402, a first likelihood data item 426 and a second likelihood data item 428 are applied in min-sum based LDPC decoding. The data map 1000 has a first number of columns and a second number of rows. Each row corresponds to a fixed value of the second likelihood data item 428, and the first likelihood data item 426 increases from left to right. Each column corresponds to a fixed value of the first likelihood data item 426, and the second likelihood data item 428 increases from top to bottom. The data map 1000 shows value combinations of the first number of discrete values of the first likelihood data item 426 and the second number of discrete values of the second likelihood data item 428. Referring to FIG. 10, in this example, 64 value combinations are formed by 8 values of the first likelihood data item 426 and 8 values of the second likelihood data item 428, and listed in the data map 1000. Additionally, the first likelihood data item 426 is less than or equal to the second likelihood data item 428, and the second likelihood data item 428 is greater than or equal to the first likelihood data item 426 and less than or equal to remaining likelihood data items of a subset of codeword symbols corresponding to a set of variable nodes 404 of the respective check node 402. Given the first likelihood data item 426 is smaller than the second likelihood data item 428, a first set of eliminated value combinations 1004-1 of the likelihood data items 426 and 428 is marked with "x" and does not exist. The data map 1000 includes 36 remaining value combinations distinct from the first set of eliminated value combinations 1004-1 of the likelihood data items 426 and 428.

In some embodiments, a subset of the 36 remaining value combinations is associated with the set of data bits 1002. Each of the subset of the 36 remaining value combinations is represented by a respective set of data bits 1002. For example, the subset of the 36 remaining value combinations excludes a second set 1004-2 of value combinations of the likelihood data items 426 and 428, and includes 32 remaining value combinations. The second set of eliminated value combinations 1004-2 corresponds to the second likelihood data item 428 equal to 6 and the first likelihood data item 426 equal to any of 0-3. The 32 remaining value combinations 1006 labeled with "0" are uniquely represented by the set of 5 data bits 1002. For example, the 32 remaining value combinations are represented by 00000, 00001, 00010, . . . , and 11111, respectively. The first and second likelihood data items 426 and 428 correspond to 36 possible value combinations, and a binary data item representing these 36 possible value combinations has at least 6 bits, which is 1 bit more than the set of data bits 1002. In other words, the first and second likelihood data items 426 and 428 are represented by the set of data bits 1002 in a lossy manner (e.g., making the second set of value combinations 1004-2 of the likelihood data items 426 and 428 unavailable), which allows saving 1-bit register space for each check node 402.

Referring to FIG. 10, in some embodiments, the 32 remaining value combinations labeled with "0" correspond to a set of selected value combinations 1006, and exclude the first and second sets of eliminated value combinations 1004-1 and 1004-2. The set of selected value combinations 1006 is complementary to a set of eliminated value combinations 1004 that combines the first and second sets 1004-1 and 1004-2. In some embodiments, for each of the set of eliminated value combinations 1004, the first likelihood data item 426 is in a first eliminated range, and the second likelihood data item 428 in a second eliminated range. For example, for the second set of value combinations 1004-2, the first eliminated range 10, 31, and the second eliminated range includes a value of 6.

In some embodiments, during decoding, in accordance with a determination that the value combination 1012 of the likelihood data items 426 and 428, e.g., (1, 6), belongs to the set of eliminated value combinations 1004, the second likelihood data item 428 is approximated with a closest value (e.g., 5 or 7) that is available, while keeping a value (e.g., 1) of the first likelihood data item 426. The value combination 1012 is updated based on the approximated value of the second likelihood data item 428, and the set of data bits 1002 is determined based on the updated value combination 1014. For example, the value combination (1, 6) is updated to (1, 7), which is associated with the set of data bits 1002 of "11001". In another example, the value combination (1, 6) is updated to (1, 5).

FIG. 11 illustrates a lookup table 1102 and a formula 1104 applied to associate value combinations 1006 of two data items of check node data 422 with a set of data bits 1002, in accordance with some embodiments. The set of data bits 1002 is determined based on a value combination of a plurality of data items that are compressed for each check node 402. The set of data bits uniquely identifies the value combination among a set of selected value combinations 1006 according to a predefined relationship. In some embodiments, the predefined relationship is defined with the lookup table 1102 that (e.g., uniquely) associates the set of data bits 1002 with the set of selected value combinations 1006. In an example (e.g., FIG. 10), selected value combinations 1006 are successively numbered from 0 to 31, and each selected value combination 1006 is represented with a set of data bits 1002 corresponding to a respective successive number. Alternatively, in some embodiments, the predefined relationship is defined with the formula 1104 that (e.g., uniquely) associates the set of data bits 1002 with the set of selected value combinations 1006.

The first likelihood data item 426 corresponds to a first codeword symbol and a second likelihood data item 428 corresponds to a second codeword symbol. The second likelihood data item 428 is greater than or equal to the first likelihood data item 426. During encoding, in accordance with a determination that a value combination corresponding to values of the likelihood data items 426 and 428 is included in the lookup table 1102, the integrity engine 230 determines the set of data bits 1002 from the lookup table 1102 based on the value combination. Conversely, in accordance with a determination that the value combination corresponding to the values of the likelihood data items 426 and 428 is not included in the lookup table 1102, the integrity engine 230 approximates at least one of the values of the likelihood data items 426 and 428 based a value approximation rule (e.g., using a closest and available value), and determines the set of data bits 1002 from the lookup table 1102 based on a corresponding approximated value combination. During decoding, the integrity engine 230 determines a value combination and corresponding values of the likelihood data items 426 and 428 based on the set of data bits 1002.

In some embodiments, during encoding, the integrity engine 230 determines the set of data bits 1002 from the formula 1104 based on the value combination corresponding to values of the likelihood data items 426 and 428 is included in the lookup table 1102. During decoding, the integrity engine 230 determines a value combination and corresponding values of the likelihood data items 426 and 428 from the formula I 104 based on the set of data bits 1002.

Figure 12:
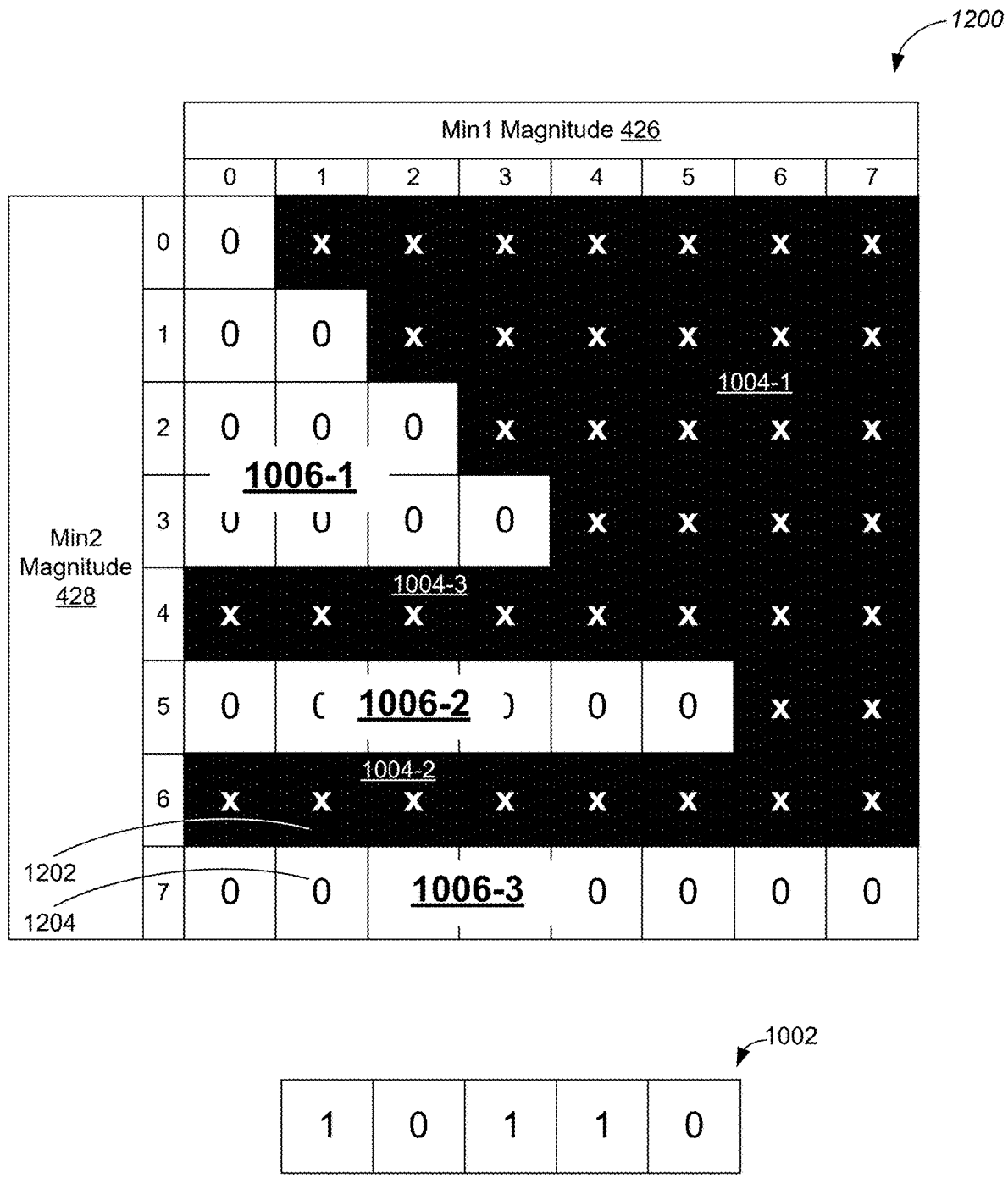
FIG. 12 is another example data map illustrating example value combinations of two likelihood data items of check node data of each check node, in accordance with some embodiments.

FIG. 12 is another example data map 1200 illustrating example value combinations of two likelihood data items 426 and 428 of check node data 422 of each check node 402, in accordance with some embodiments. The check node data 422 includes a plurality of data items (e.g., likelihood data items 426 and 428), and indicates a likelihood of the subset of codeword symbols being erroneous. A set of data bits 1002 are determined based on a value combination of the plurality of data items to uniquely identify the value combination among a set of selected value combinations 1006 (e.g., 1006-1, 1006-2, and 1006-3) according to a predefined relationship (e.g., lookup table 1102 and formula 1104 in FIG. 11). The set of data bits 1002 is stored in a memory block (e.g., registers 232) to represent the plurality of data items of the check node data 422 of the check node 402, saving at least one bit register space. The data map 1200 has a first number of columns and a second number of rows. Each row corresponds to a fixed value of the second likelihood data item 428, and the first likelihood data item 426 increases from left to right. Each column corresponds to a fixed value of the first likelihood data item 426, and the second likelihood data item 428 increases from top to bottom. The data map 1200 shows value combinations of the first number of discrete values of the first likelihood data item 426 and the second number of discrete values of the second likelihood data item 428. Referring to FIG. 12, in this example, 64 value combinations are formed by 8 values of the first likelihood data item 426 and 8 values of the second likelihood data item 428, and listed in the data map 1200.

The data map 1200 includes the set of selected value combinations 1006 (e.g., 1006-1, 1006-2, and 1006-3) and a set of eliminated value combinations 1004 (e.g., 1004-1, 1004-2, and 1004-3) that is complementary to the set of selected value combinations 1006. Referring to FIG. 12, in some embodiments, the second likelihood data item 428 has a most significant bit (MSB) and a least significant bit (LSB), and for each of the set of eliminated value combinations 1004 (e.g., 1004-2 and 1004-3), the MSB and LSB of the second likelihood data item 428 are equal to "1" and "0", respectively, independently of the first likelihood data item 426. In some embodiments, during encoding, in accordance with a determination that a value combination 1202 of the likelihood data items 426 and 428, e.g., (1, 6), belongs to the set of eliminated value combinations 1004, the second likelihood data item 428 is approximated with a closest value (e.g., 5 or 7) that is available, while keeping a value (e.g., 1) of the first likelihood data item 426. The value combination 1202 is updated based on the approximated value of the second likelihood data item 428, and the set of data bits 1002 is determined based on the updated value combination 1204. For example, the value combination (1, 6) is updated to (1, 7), which is associated with the set of data bits 1002 of "11001". During decoding, the set of data bits 1002 is decoded to (1, 7) without being modified to (1, 6), and such a data compression scheme thereby causes a loss of the value combination (1, 6) of the likelihood data items 426 and 428.

In some embodiments, for each of the set of eliminated value combinations 1004, the first likelihood data item 426 is in a first eliminated range, and the second likelihood data item 428 in a second eliminated range. For example, for the second and third sets of value combinations 1004-2 and 1004-3, the first value range [0, 7], and the second value range includes two discrete values of 4 and 6.

In some embodiments, the MSB of the second likelihood data item 428 is identified. In accordance with a determination that the MSB of the second likelihood data item 428 is equal to 0, the integrity engine 230 does not store the MSB of the first likelihood data item 426, which is equal to 0 as well. In accordance with a determination that the MSB of the second likelihood data item 428 is equal to 1, the integrity engine 230 does not store the LSB of the second likelihood data item 428, and sets it to 1. Stated another way, the integrity engine 230 stores either the MSB of the first likelihood data item 426 or the LSB of the second likelihood data item 428.

In some embodiments, the integrity engine 230 saves 1 bit storage space in the registers 232 for each check node 402, while adding data compression and data decompression logic. As such, compression of likelihood data items of each check node 402 helps conserve expensive register space, resulting in a net gate count reduction in compression and decompression logics of the integrity check system 300, while causing no or few negative effects to the BER of the data read from the memory system 200.

FIGS. 13-16 are example data maps 1300, 1400, 1500, and 1600 illustrating different lossy value combinations of two 5-bit data items of check node data 422 of each check node 402, in accordance with some embodiments. The check node data 422 includes a plurality of data items (e.g., likelihood data items 426 and 428). A set of data bits 1002 are determined based on a value combination of the plurality of data items to uniquely identify the value combination among a set of selected value combinations 1006 (which are marked with "0") according to a predefined relationship (e.g., lookup table 1102 and formula 1104 in FIG. 11). The set of data bits 1002 is stored in a memory block (e.g., registers 232) to represent the plurality of data items of the check node data 422 of the check node 402, saving at least one bit register space.

Each data map 1300, 1400, 1500, or 1600 includes value combinations of the first likelihood data item 426 and the second likelihood data item 428, and has a first number of columns (e.g., 32 columns) and a second number of rows (e.g., 32 rows). Each row corresponds to a fixed value of the second likelihood data item 428, and the first likelihood data item 426 increases from left to right (e.g., from 0 to 31). Each column corresponds to a fixed value of the first likelihood data item 426, and the second likelihood data item 428 increases from top to bottom (e.g., from 0 to 31). Each data map 1300, 1400, 1500, or 1600 shows value combinations of the first number of discrete values of the first likelihood data item 426 and the second number of discrete values of the second likelihood data item 428. Referring to FIGS. 13-16, in these examples, 32×32 value combinations are formed by 32 values of the first likelihood data item 426 and 32 values of the second likelihood data item 428, and listed in the data map 1000. In some embodiments, 5 bits are used to represent each likelihood data item 426 or 428, and 10 bits are used to represent all 32-32 value combinations.

Figure 13:
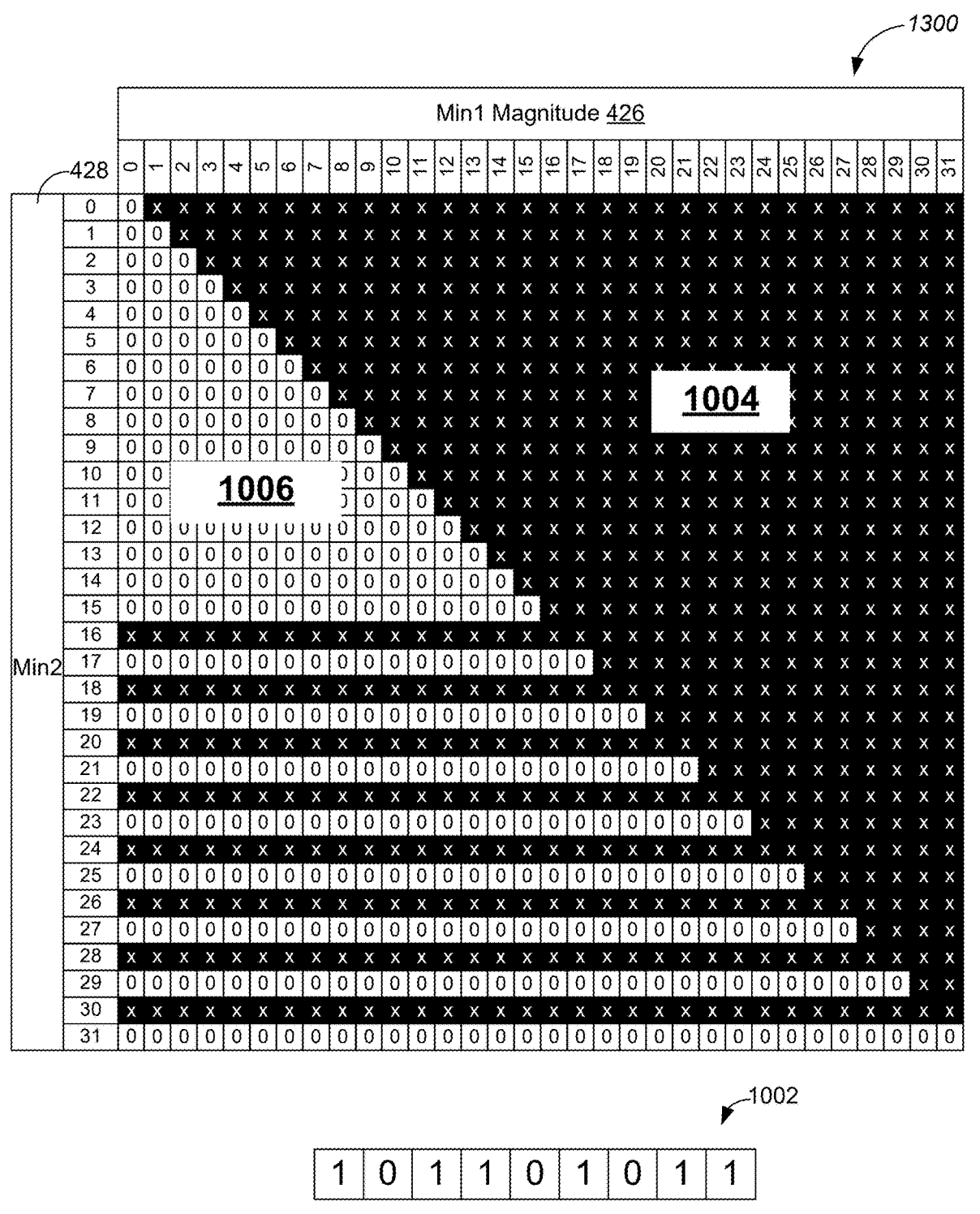
Figure 14:
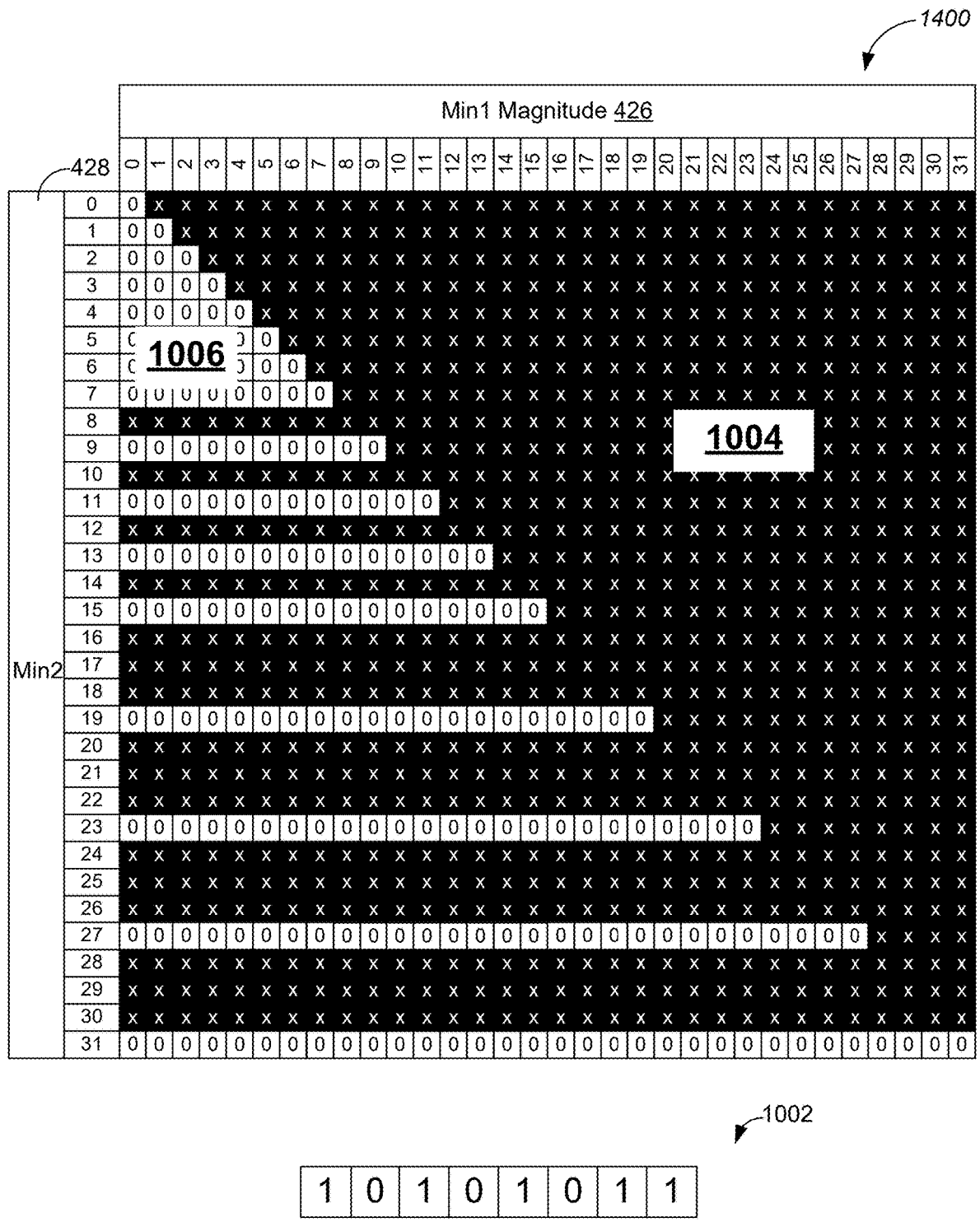
Figure 15:
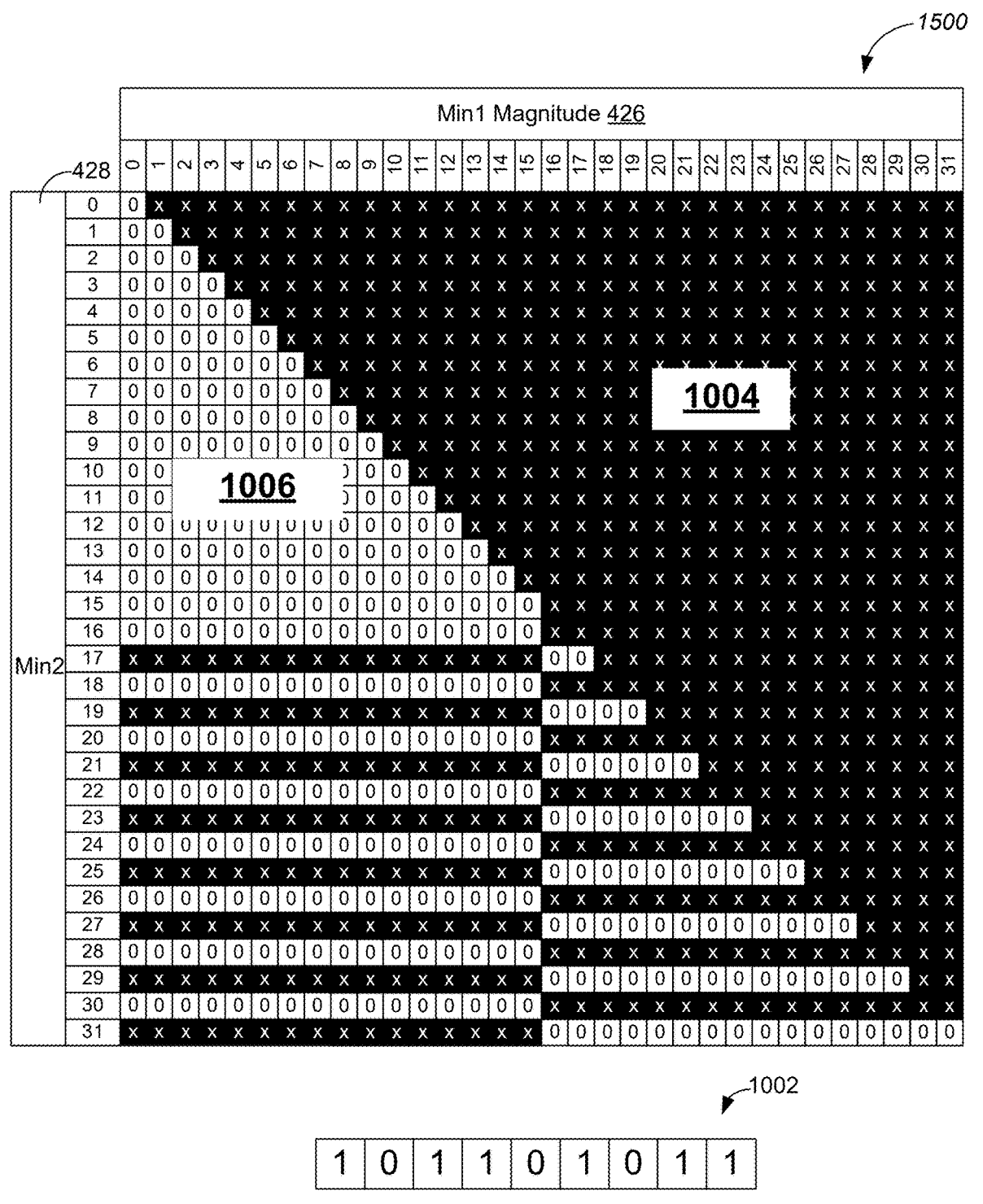
Figure 16:
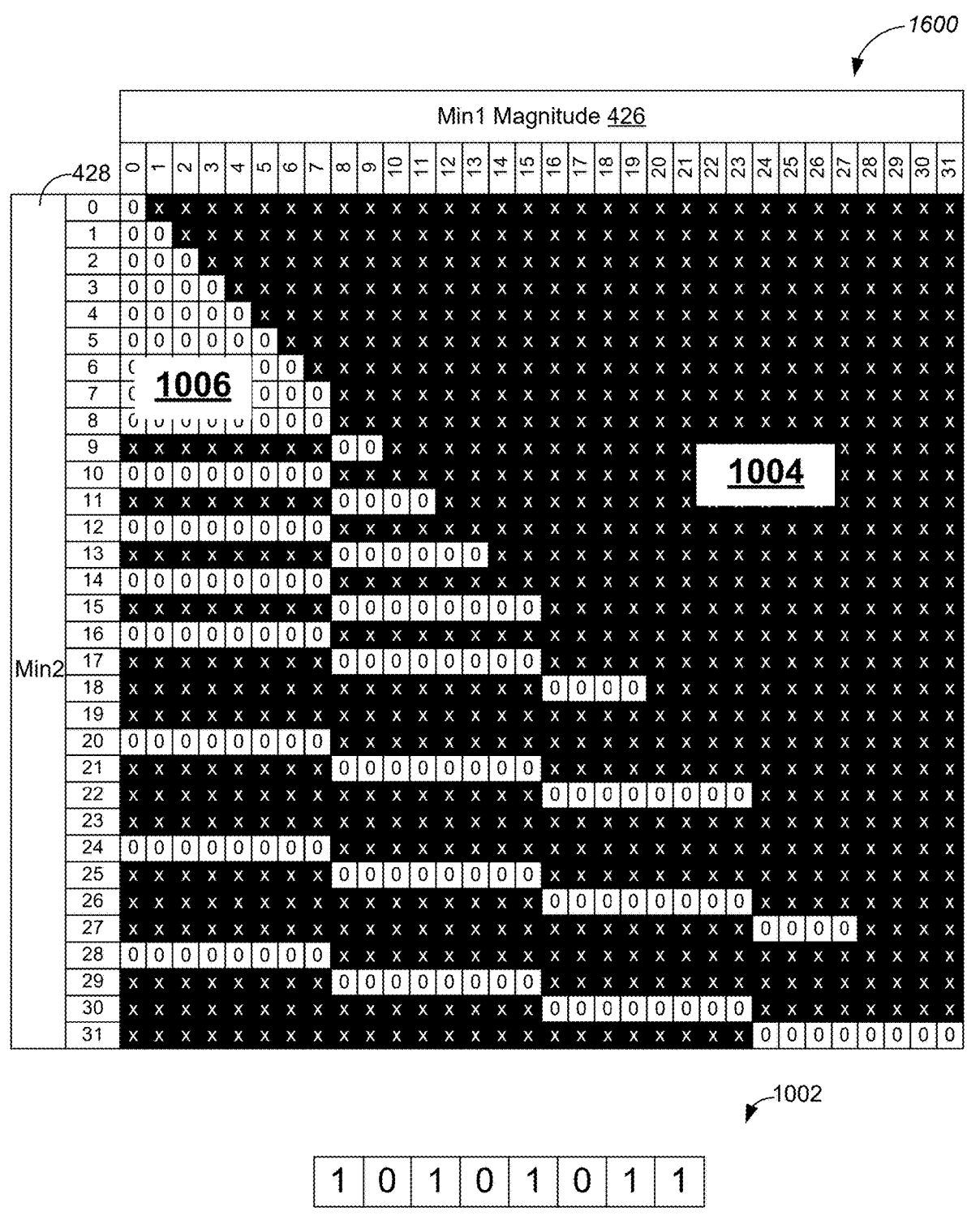

Each data map 1300, 1400, 1500, or 1600 includes the set of selected value combinations 1006 and a set of eliminated value combinations 1004 that is complementary to the set of selected value combinations 1006. Referring to FIG. 13, in some embodiments, the set of eliminated value combinations 1004 covers value combinations in which the second likelihood data item 428 is less than the first likelihood data item 426 or equal to an even integer number between 16 and 30 inclusively. The set of selected value combinations 1006 is fully represented by 9 bits in the set of data bits 1002, thereby saving 1 single bit register space for each check node 402. Referring to FIG. 14, in some embodiments, the set of eliminated value combinations 1004 covers value combinations in which the second likelihood data item 428 is less than the first likelihood data item 426 or equal to one of a set of numbers including 8, 10, 12, 14, 16-18, 20-22, 24-26, and 28-30. The set of selected value combinations 1006 is fully represented by 8 bits in the set of data bits 1002, thereby saving 2 bit register space for each check node 402. Referring to FIG. 15, in some embodiments, the set of eliminated value combinations 1004 covers value combinations in which the second likelihood data item 428 is less than the first likelihood data item 426 or in which an LSB of the second likelihood data item 428 greater than or equal to 16 is not equal to an MSB of the first likelihood data item 426. Such a compression scheme reduces a number of multiplexers applied in integrity coding. The set of selected value combinations 1006 is fully represented by 9 bits in the set of data bits 1002, thereby saving 1 single bit register space for each check node 402. Referring to FIG. 16, in some embodiments, the set of eliminated value combinations 1004 covers value combinations in which the second likelihood data item 428 is less than the first likelihood data item 426, or in which an LSB of the second likelihood data item 428 greater than or equal to 8 and less than 16 is not equal to an MSB of the first likelihood data item 426, or in which two LSBs of the second likelihood data item 428 greater than or equal to 16 are not equal to two MSBs of the first likelihood data item 426. Such a compression scheme reduces a number of multiplexers applied in integrity coding. The set of selected value combinations 1006 is fully represented by 8 bits in the set of data bits 1002, thereby saving 2 bit register space for each check node 402.

In some embodiments, for each of the set of selected value combinations 1006, the first likelihood data item 426 is in a first value range, and the second likelihood data item 428 in a second value range that optionally depends on the first value range. Further, in some embodiments, the first value range includes one or more non-consecutive first data sub-ranges, one or more predefined first data values, or a combination thereof, and the second value range includes one or more non-consecutive second data sub-ranges, one or more predefined second data values, or a combination thereof. Referring to FIG. 13, in an example, the first value range is between 0 and the second likelihood data item 428 inclusively for the set of selected value combinations 1006. The second value range includes a data sub-range [0-15] and 8 predefined second data values including 17, 19, 21, 23, 25, 27, 29, and 31. In other words, in some embodiments, for each of the set of selected value combinations 1006, the second likelihood data item 428 in a second value range including one or more non-consecutive second data sub-ranges, one or more predefined second data values, or a combination thereof. The first likelihood data item 426 is not limited except that it is less than or equal to the second likelihood data item 428.

Figure 17:
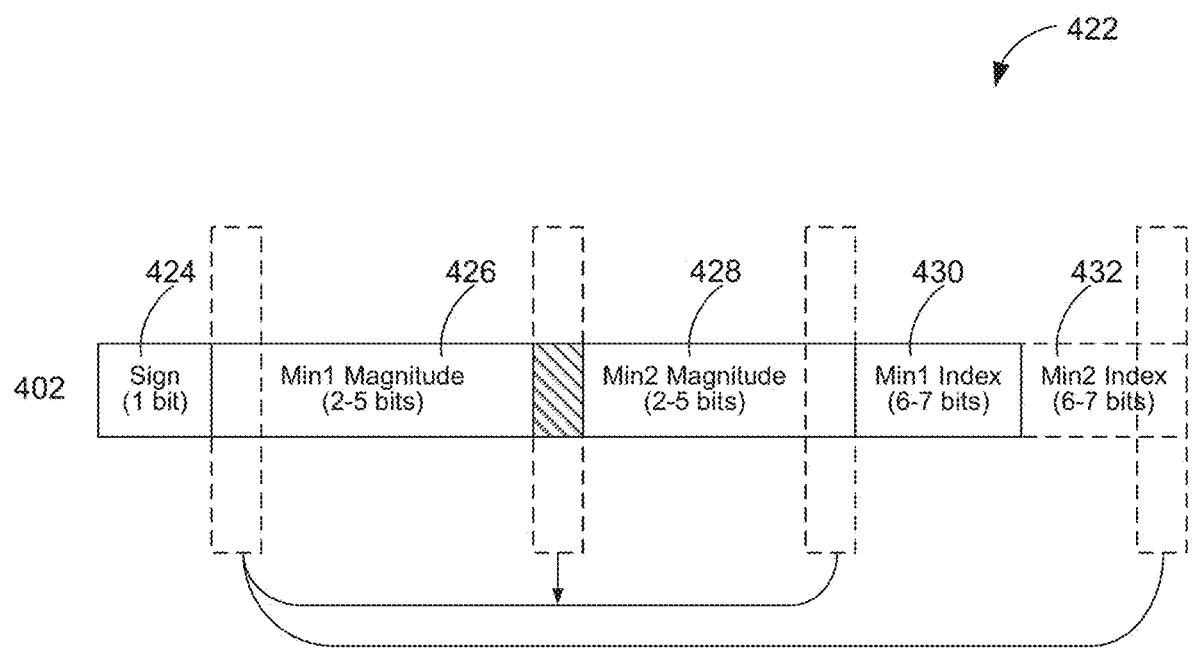
FIG. 17 is a data structure of example check node data of a check node having one or more data compression schemes, in accordance with some embodiments.

FIG. 17 illustrates a data structure of example check node data 422 of a check node 402 having one or more data compression schemes, in accordance with some embodiments. The check node data 422 includes a sign bit 424, a first likelihood data item 426, a second likelihood data item 428, and a first index data item 430. In accordance with equation (4), the sign bit 424 is generated based on signs of the variable-to-check node data $(v_1 - v_m)$ from the set of variable nodes 404. The first likelihood data item 426 and the second likelihood data item 428 include magnitudes of the most minimum variable-to-check node message data (Min1) and the second minimum variable-to-check node message data (Min2) of the set of variable nodes 404, respectively. The first index data item 430 identifies one of the sets of variable nodes 404 corresponding to the first likelihood data item 426. In some embodiments, the check node data 422 further includes a second index data item 432 identifying one of the sets of variable nodes corresponding to the second likelihood data item 428.

In some embodiments, for each check node 402, the plurality of data items that are compressed jointly includes the first likelihood data item 426 and the second likelihood data item 428 (e.g., FIGS. 10-16). In some embodiments, the set of data bits 1002 is determined by selecting only one of an MSB of the first likelihood data item 426 and an LSB of the second index data item 432 to be included in the set of data bits 1002 based on an MSB of the second likelihood data item 428. Further, in some embodiments, during encoding, in accordance with a determination that the MSB of the second likelihood data item 428 is equal to "0", the integrity engine 230 determines the set of data bits 1002 based on the LSB of the second index data item 432 and independently of the MSB of the first likelihood data item 426. In accordance with a determination that the MSB of the second likelihood data item is equal to "1", the integrity engine 230 determines the set of data bits 1002 based on the MSB of the first likelihood data item 426 and independently of the LSB of the second index data item 432.

Alternatively, in some embodiments, for each check node 402, the plurality of data items that are compressed jointly includes one of the likelihood data items 426 and 428 and one of the index data items 430 and 432. In an example, the integrity engine 230 stores one of an MSB of the first likelihood data item 426 and an LSB of the second index data item 432. In some embodiments, the integrity engine 230 is configured to compress the check node data 422 of the subset of check nodes 402 using the following logic that is optionally loaded in the registers 232:

```
If (Min2 Magnitude >= 8)
    Set LSB of Min2 Index to 0
    if (Min2 Magnitude >= 16)
        Set LSB of Min2 Magnitude to 1
```

After compression, the set of data bits 1002 requires one or two data bits less than a sum of data bits in the plurality of data items for representing all possible values of the data items in the set of selected value combinations 1006. Compression of these data items of each check node 402 helps conserve expensive register space and reduce gate count in compression and decompression logics of the integrity check system 300, while causing no or few negative effects to the BER of the data read from the memory system 200.

FIG. 18 is a flow diagram of a method 1800 for compressing check node data 422 for an electronic device, in accordance with some embodiments. The method 1800 is implemented at an electronic device including the memory system 200 (FIG. 2). At steps 1802 and 1804, the electronic device identifies a check node 402 corresponding to a subset of codeword symbols in a block of data and determines check node data 422 including a plurality of data items. The check node data 422 indicates a likelihood of the subset of codeword symbols being erroneous. At step 1806, the electronic device determines a set of data bits 1002 based on a value combination of the plurality of data items. At step 1808, the set of data bits 1002 uniquely identifies the value combination among a set of selected value combinations 1006 according to a predefined relationship (e.g., the lookup table 1102 and the formula 1104 in FIG. 11). At step 1810, the electronic device stores, in a memory block, the set of data bits 1002 representing the plurality of data items of the check node data 422 of the check node 402. At step 1812, each of the plurality of data items requires at least a first number of data bits to represent all possible values of the respective data item, and the set of data bits 1002 has a second number of data bits. At step 1814, the second number is smaller than a sum of the first number of each of the plurality of data items, e.g., by 1 bit, by 2 bits.

In some embodiments, at step 1816, the plurality of data items corresponds to a total number of possible value combinations, and a binary data item that represents the total number has more bits than the set of data bits 1002, indicating that compression of the plurality of data items is lossy.

In some embodiments, at step 1818, the plurality of data items includes a first likelihood data item 426 corresponding to a first codeword symbol and a second likelihood data item 428 corresponding to a second codeword symbol, and the second likelihood data item 428 is greater than or equal to the first likelihood data item 426; and the set of selected value combinations 1006 is complementary to a set of eliminated value combinations 1004. Further, in some embodiments, determining the set of data bits 1002 further includes, in accordance with a determination that the value combination belongs to the set of eliminated value combinations 1004: approximating the second likelihood data item 428 with an adjacent value that is available, while keeping a value of the first likelihood data item 426; updating the value combination of the plurality of data items based on the approximated value of the second likelihood data item 428; and determining the set of data bits 1002 based on the updated value combination.

In some embodiments, for each of the set of selected value combinations 1006, the first likelihood data item 426 is in a first value range, and the second likelihood data item 428 in a second value range. Further, in some embodiments, the first value range includes one or more non-consecutive first data sub-ranges, one or more predefined first data values, or a combination thereof, and the second value range includes one or more non-consecutive second data sub-ranges, one or more predefined second data values, or a combination thereof.

In some embodiments, for each of the set of selected value combinations 1006, the second likelihood data item 428 in a second value range includes one or more non-consecutive second data sub-ranges, one or more predefined second data values, or a combination thereof.

In some embodiments, the second likelihood data item 428 has a most significant bit (MSB) and a least significant bit (LSB). For each of the set of selected value combinations 1006, the MSB and LSB of the second likelihood data item 428 are not equal to "1" and "0", respectively, independently of the first likelihood data item 426.

In some embodiments, the plurality of data items include a first likelihood data item 426 corresponding to a first codeword symbol, a second likelihood data item 428 corresponding to a second codeword symbol, and a second index data item identifying one of the subset of codeword symbols corresponding to the second likelihood data item 428 of the check node data 422; the second likelihood data item 428 is greater than or equal to the first likelihood data item 426; and determining the set of data bits 1002 further comprises selecting only one of an MSB of the first likelihood data item 426 and an LSB of the second index data item to be included in the set of data bits 1002 based on an MSB of the second likelihood data item 428. Further, in some embodiments, selecting only one of the MSB of the first likelihood data item 426 and the LSB of the second index data item further comprising: in accordance with a determination that the MSB of the second likelihood data item 428 is equal to "0", determining the set of data bits 1002 based on the LSB of the second index data item and independently of the MSB of the first likelihood data item 426; and in accordance with a determination that the MSB of the second likelihood data item 428 is equal to "1", determining the set of data bits 1002 based on the MSB of the first likelihood data item 426 and independently of the LSB of the second index data item.

In some embodiments, the second number is smaller than the sum of the first number of each of the plurality of data items by 1 or 2, thereby 1 or 2 bits are saved for storing the check node data 422.

In some embodiments, the subset of codeword symbols corresponds to a set of likelihood data items, each likelihood data item indicating a likelihood of a respective codeword symbol being erroneous. The electronic device identifies a first likelihood data item 426 and a second likelihood data item 428, in accordance with a determination that the second likelihood data item 428 is greater than or equal to the first likelihood data item 426 and less than or equal to remaining likelihood data items of the subset of codeword symbols. Further, in some embodiments, each likelihood data item of the respective codeword symbol is determined based on a log-likelihood ratio (LLR) that is approximated by equation (6).

In some embodiments, at step 1820, plurality of data items further includes at least one of: a first index data item 430 identifying one of the subsets of codeword symbols corresponding to a first likelihood data item 426 of the check node data 422 and a second index data item 432 identifying one of the subsets of codeword symbols corresponding to a second likelihood data item 428 of the check node data 422.

In some embodiments, each of the subset of codeword symbols corresponds to a respective likelihood data item indicating a likelihood of the respective codeword symbol being erroneous, and wherein the check node data 422 of the check node 402 further includes a sign bit that is a combination of signs of respective likelihood data items of the subset of codeword symbols.

Memory is also used to store instructions and data associated with the method 1800, and includes high-speed random-access memory, such as DRAM, SRAM, or other random-access solid state memory devices; and, optionally, includes non-volatile memory, such as one or more magnetic disk storage devices, one or more optical disk storage devices, one or more flash memory devices, or one or more other non-volatile solid state storage devices. The memory, optionally, includes one or more storage devices remotely located from one or more processing units. Memory, or alternatively the non-volatile memory within memory, includes a non-transitory computer readable storage medium. In some embodiments, memory, or the non-transitory computer readable storage medium of memory, stores the programs, modules, and data structures, or a subset or superset for implementing method 1800.

Some implementations of this application are directed to compressing check node data for an electronic device. The electronic device identifies a check node corresponding to a subset of codeword symbols in a block of data and determines check node data that indicates a likelihood of the subset of codeword symbols being erroneous. A set of data bits are determined based on a value combination of data items of the check node data to uniquely identify the value combination among a set of selected value combinations according to a predefined relationship. The electronic device stores, in a memory block, the set of data bits representing the data items of the check node data of the check node. Each data item requires more data bits to represent all possible values of the respective data item than data bits of the set of data bits. More specifically, some implementations of this application are described in the following clauses:

Clause 1. A method implemented at an electronic device for compressing check node data, the method comprising: identifying a check node corresponding to a subset of codeword symbols in a block of data; determining check node data including a plurality of data items, wherein the check node data indicates a likelihood of the subset of codeword symbols being erroneous; determining a set of data bits based on a value combination of the plurality of data items, wherein the set of data bits uniquely identifies the value combination among a set of selected value combinations according to a predefined relationship; and storing, in a memory block, the set of data bits representing the plurality of data items of the check node data of the check node; wherein each of the plurality of data items requires at least a first number of data bits to represent all possible values of the respective data item, and the set of data bits has a second number of data bits, the second number being smaller than a sum of the first number of each of the plurality of data items.

Clause 2. The method of clause 1, wherein the plurality of data items corresponds to a total number of possible value combinations, and a binary data item representing the total number has more bits than the set of data bits.

Clause 3. The method of clause 1 or 2, wherein: the plurality of data items includes a first likelihood data item corresponding to a first codeword symbol and a second likelihood data item corresponding to a second codeword symbol, and the second likelihood data item is greater than or equal to the first likelihood data item; and the set of selected value combinations is complementary to a set of eliminated value combinations.

Clause 4. The method of clause 3, determining the set of data bits further comprising, in accordance with a determination that the value combination belongs to the set of eliminated value combinations: approximating the second likelihood data item with an adjacent value that is available, while keeping a value of the first likelihood data item; updating the value combination of the plurality of data items based on the approximated value of the second likelihood data item; and determining the set of data bits based on the updated value combination.

Clause 5. The method of any of clauses 1-4, wherein for each of the set of selected value combinations, the first likelihood data item is in a first value range, and the second likelihood data item in a second value range.

Clause 6. The method of clause 5, wherein the first value range includes one or more non-consecutive first data sub-ranges, one or more predefined first data values, or a combination thereof, and the second value range includes one or more non-consecutive second data sub-ranges, one or more predefined second data values, or a combination thereof.

Clause 7. The method of any of clauses 1-6, wherein for each of the set of selected value combinations, the second likelihood data item in a second value range including one or more non-consecutive second data sub-ranges, one or more predefined second data values, or a combination thereof.

Clause 8. The method of any of clauses 1-7, wherein the second likelihood data item has a most significant bit (MSB) and a least significant bit (LSB), and for each of the set of selected value combinations, the MSB and LSB of the second likelihood data item are not equal to "1" and "0", respectively, independently of the first likelihood data item.

Clause 9. The method of any of clauses 1-8, wherein: the plurality of data items include a first likelihood data item corresponding to a first codeword symbol, a second likelihood data item corresponding to a second codeword symbol, and a second index data item identifying one of the subset of codeword symbols corresponding to the second likelihood data item of the check node data; the second likelihood data item is greater than or equal to the first likelihood data item; and determining the set of data bits further comprises selecting only one of an MSB of the first likelihood data item and an LSB of the second index data item to be included in the set of data bits based on an MSB of the second likelihood data item.

Clause 10. The method of clause 9, selecting only one of the MSB of the first likelihood data item and the LSB of the second index data item further comprising: in accordance with a determination that the MSB of the second likelihood data item is equal to "0", determining the set of data bits based on the LSB of the second index data item and independently of the MSB of the first likelihood data item; and in accordance with a determination that the MSB of the second likelihood data item is equal to "1", determining the set of data bits based on the MSB of the first likelihood data item and independently of the LSB of the second index data item.

Clause 11. The method of any of clauses 1-10, wherein the second number is smaller than the sum of the first number of each of the plurality of data items by 1 or 2, thereby 1 or 2 bits are saved for storing the check node data.

Clause 12. The method of any of clauses 1-11, wherein the subset of codeword symbols corresponds to a set of likelihood data items, each likelihood data item indicating a likelihood of a respective codeword symbol being erroneous, and wherein the method further comprises: identifying a first likelihood data item and a second likelihood data item, in accordance with a determination that the second likelihood data item is greater than or equal to the first likelihood data item and less than or equal to remaining likelihood data items of the subset of codeword symbols.

Clause 13. The method of clause 12, wherein each likelihood data item of the respective codeword symbol is determined based on a log-likelihood ratio (LLR) that is approximated as follows:

$$LLR(y) = \ln\frac{p(x=0\,|\,y)}{p(x=1\,|\,y)} = \ln\frac{p(y\,|\,x=0)}{p(y\,|\,x=1)}$$

where p(|) is a probability of a combination of data values, x is a value stored for the respective codeword symbol, and y is a correct value of the respective codeword symbol.

Clause 14. The method of any of clauses 1-13, wherein the plurality of data items further includes at least one of: a first index data item identifying one of the subsets of codeword symbols corresponding to a first likelihood data of the check node data and a second index data item identifying one of the subsets of codeword symbols corresponding to a second likelihood data of the check node data.

Clause 15. The method of any of clauses 1-14, wherein each of the subset of codeword symbols corresponds to a respective likelihood data item indicating a likelihood of the respective codeword symbol being erroneous, and wherein the check node data of the check node further includes a sign bit that is a combination of signs of respective likelihood data items of the subset of codeword symbols.

Clause 16. An electronic device, comprising: one or more processors; and memory having instructions stored thereon, which when executed by the one or more processors cause the processors to perform a method of any of clauses 1-15.

Clause 17. A non-transitory computer-readable storage medium, having instructions stored thereon, which when executed by one or more processors cause the processors to perform a method of any of clauses 1-15.

Reconfiguring Registers for Different Low Density Parity Checks

Figure 19:
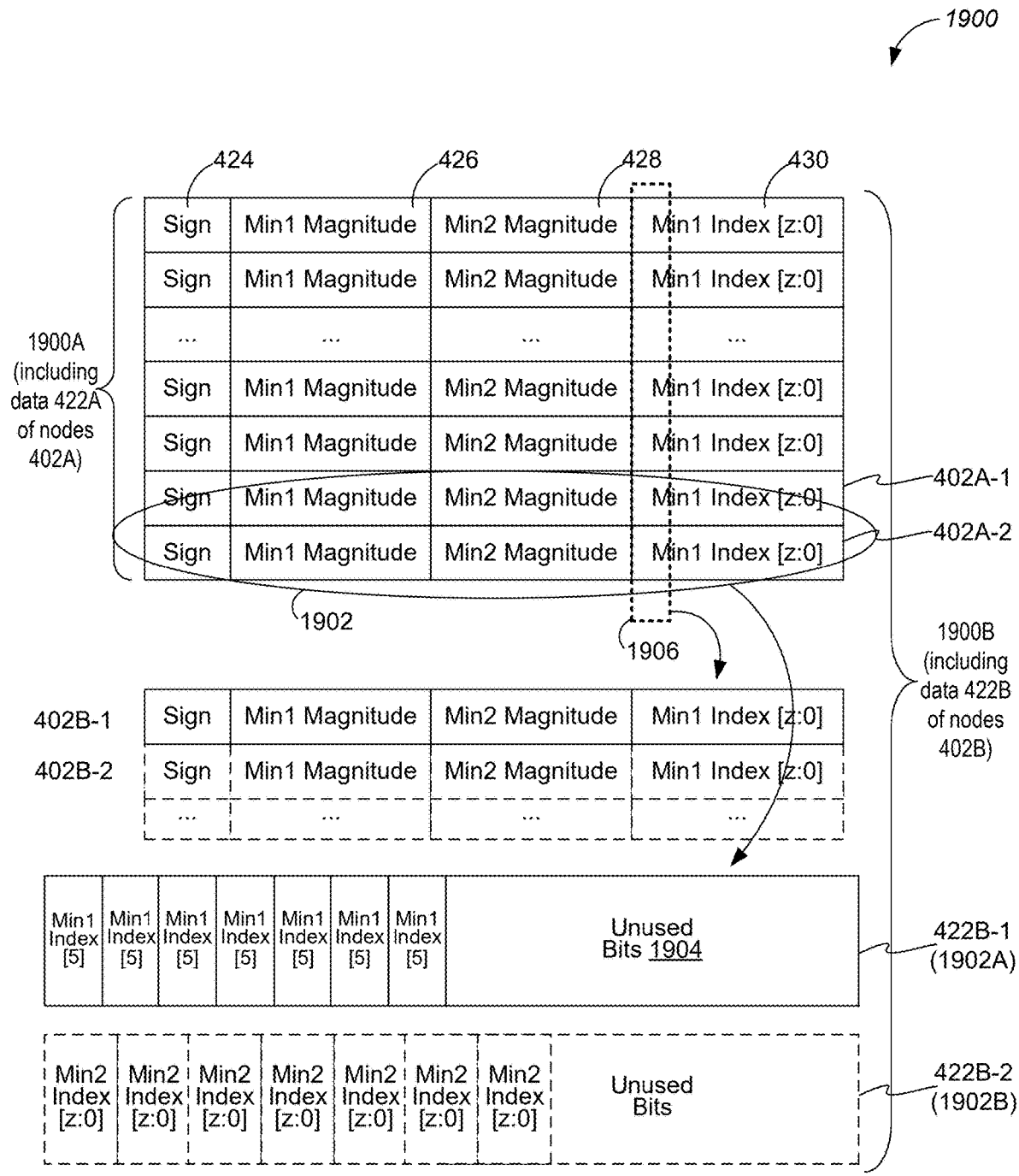
FIG. 19 is a diagram illustrating two example data structures of check node data temporarily stored in a memory block, in accordance with some embodiments.

FIG. 19 is a diagram illustrating two example data structures 1900 of check node data 422 temporarily stored in a memory block (e.g., registers 232 in FIG. 2), in accordance with some embodiments. The same memory block is adaptively applied to store check node data 422 according to two different data structures 1900A and 1900B. A block of data corresponds to a plurality of first check nodes 402A, and each first check node 402A corresponds to a first subset of codeword symbols of the block of data, and has respective first check node data 422A that indicates a likelihood of the first subset of codeword symbols being erroneous. In accordance with a first data structure 1900A, the memory block is allocated to store first check node data 422A of the plurality of first check nodes 402A. Data bits of the block of data are regrouped, e.g., by an integrity engine 230 in FIG. 2, to form a plurality of second check nodes 402B. Each second check node 402B (e.g., 402B-1, 402B-2, or other unshown second check node) corresponds to a second subset of codeword symbols of the block of data and has respective second check node data 422B (e.g., 422B-1, 422B-2, or other unshown second node data) that indicates a likelihood of the second subset of codeword symbols being erroneous. In accordance with a second data structure 1900B, the memory block is reconfigured to store second check node data 422B of the plurality of second check nodes 402B. The plurality of second check nodes 402B has a distinct number of check nodes from the plurality of first check nodes 402A.

In some embodiments, the first check nodes 402A has a greater number of check nodes than the second check nodes 402B. For simplicity, in an example, the block of data includes 1280 codeword symbols, and corresponds to 40 first check nodes 402A each of which is associated with 32 codeword symbols. For each first check node 402A, the 32 codeword symbols are identified by a 5-bit first index data item 430 (i.e., z=4 in the first index data item 430). The check node data 422A of the 40 first check nodes 402A is organized according to the first data structure 1900A. The 1280 codeword symbols are regrouped according to 32 second check nodes 402B each of which is associated with 40 codeword symbols. For each second check node 402B, the 40 codeword symbols are identified by a 6-bit first index data item 430, e.g., in need of one additional data bit for the first index data item 430. The second check node data 422B of the 32 second check nodes 402B is organized according to the second data structure 1900B.

In some embodiments, the integrity engine 230 identifies one or more excessive check nodes 402A-1 and 402A-2 in the plurality of first check nodes 402A. Excessive check node data 422A of the one or more excessive check nodes 402A-1 and 402A-2 form a plurality of excessive bits 1902. The plurality of excessive bits 1902 is reassigned to store second check node data 422B-1 or 422B-2 of the plurality of second check nodes 402B. Further, in some embodiments, the plurality of excessive bits 1902 is reassigned by assigning a first set of excessive bits 1902A of excessive check node data of a first excessive check node 402A-1 to store the second check node data 422B-1 of a first subset of the plurality of second check nodes 402B and assigning a second set of excessive bits 1902B of the excessive check node data of a second excessive check node 402A-2 to store the second check node data 422B-1 of the first subset or a second subset of the plurality of second check nodes 402B. For example, the set of excessive bits 1902A created by the first check node 402A-1 is used to add one more bit (e.g., Min1 Index 151) to the first index data items 430 for a subset or all of the second check nodes 402B, and the set of excessive bits 1902B created by the first check node 402A-1 is used to add a subset or all of the second index data items 432 for a subset or all of the second check nodes 402B.

In some embodiments, the plurality of excessive bits 1902 includes at least one remaining bit 1904 that is not assigned to any of the second check node data 422B of the plurality of second check nodes 402B. In some embodiments, a set of excessive check nodes (e.g., 402A-1 and 402A-2) is identified in the plurality of first check nodes 402A to provide the plurality of excessive bits 1902, and a respective subset of the plurality of excessive bits is assigned to the second check data (e.g., Min1 Index [5])) of each and every second check node 402B.

Stated another way, in some embodiments, the first subset of codeword symbols corresponding to each first check node 402A includes a first number of codeword symbols, and the second subset of codeword symbols corresponding to each second check node 402B includes a second number of codeword symbols. The first number is less than the second number. An excessive check node 402A-1 or 402A-2 has excessive check node data including a plurality of excessive bits 1902. The plurality of excessive bits 1902 is assigned to index data items 430 or 432 of second check node data 422B of the plurality of second check nodes 402B.

In some embodiments, the second check nodes 402B has a greater number of check nodes than the first check nodes 402A. For simplicity, in an example, the block of data includes 1280 codeword symbols, and corresponds to 32 first check nodes 402A each of which is associated with 40 codeword symbols. For each first check node 402A, the 40 codeword symbols are identified by a 6-bit first index data item 430 (i.e., z=5 in the first index data item 430). The check node data 422A of the 32 first check nodes 402A is organized according to the first data structure 1900A. The 1280 codeword symbols are regrouped according to 40 second check nodes 402B each of which is associated with 32 codeword symbols. For each second check node 402B, the 32 codeword symbols are identified by a 5-bit first index data item 430, e.g., sparing one excessive data bit from each first index data item 430. The second check node data 422B of the 40 second check nodes 402B is organized according to the second data structure 1900B.

In some embodiments, the integrity engine 230 identifies one or more excessive bits 1906 (e.g., Min1 Index [5] of the first index data item 430) in the respective first check node data 422A of each of the plurality of first check nodes 402A. Excessive bits 1906 of the respective first check node data 422A of a first subset (e.g., less than all, all) of the plurality of first check nodes 402A are grouped to store additional check node data 422B of an additional check node 402B of the plurality of second check nodes 402B. Specifically, in some embodiments, one excessive bit (e.g., Min1 Index 151 of the first index data item 430) is identified in respective first check node data 422A of each of the plurality of first check nodes 402A, and the excessive bits 1906 of the respective first check node data of the plurality of first check nodes are grouped to store the additional check node data of two or more additional check nodes, including the additional check node 402B-1 or 402B-2, of the plurality of second check nodes 402B. For example, Min1 Index [5] of the first index data item 430 of each of the check nodes 402A is consolidated and applied to store the sign bit 424, first likelihood data item 426, second likelihood data item 428, and first index data item 430 of an additional check node 402B-1 or 402B-2. In another example, two or more bits 1906 of the first index data item 430 of each of the check nodes 402A are consolidated and applied to store check node data of one or more additional check nodes 402B. In some embodiments, the data items 424, 426, 428, and 430 of the additional check node 402B-1 or 402B-2 are stored in a distributed manner among a subset of second check node data 422B converted from, and corresponding to, the first check node data 422A.

In some embodiments, the additional check node includes a first additional check node 402B-1. Excessive bits 1906 of the respective first check node data of a second subset (e.g., less than all, all) of the plurality of first check nodes 402A to store additional check node data 422B of the first additional check node 402A-1 or a second additional check node 402B-2 of the plurality of second check nodes 402B. For example, first unused excessive bits 1906 of the first index data items 430 of the top 50 check nodes 402A are consolidated and applied to store check node data 422B of the check node 402B-1, and second distinct excessive bits 1906 of the first index data items 430 of the remaining 50 check nodes 402A are consolidated and applied to store check node data 422B of the check node 402B-2. In another example, first unused excessive bits 1906 of the first index data items 430 of all check nodes 402A are consolidated and applied to store check node data 422B of the check node 402B-1, and second distinct excessive bits 1906 of the first index data items 430 of all check nodes 402A are consolidated and applied to store check node data 422B of the check node 402B-2.

In some embodiments, for a third subset of the plurality of first check nodes 402A, a subset or all of the excessive bits of the respective first check node data 422A are not reassigned to store any additional check node data 422B of the plurality of second check nodes 422B.

In some embodiments, for each of the plurality of first check nodes 402A and the plurality of second check nodes 402B, the respective check node data 422 includes a first likelihood data item 426 and an index data item 430 identifying one of the respective subsets of codeword symbols corresponding to the first likelihood data item 426. Further, in some embodiments, the first subset of codeword symbols corresponding to each first check node 402A includes a first number of codeword symbols, and the second subset of codeword symbols corresponding to each second check node 402B includes a second number of codeword symbols. The first number is greater than the second number. The index data item 430 of each of the plurality of first check nodes 402A includes at least one excessive bit (e.g., in 1906) to address the first number of codeword symbols than the index data item 430 of each of the plurality of second check nodes 402B. The at least one excessive bit of each of the plurality of first check nodes 402A forms a plurality of excessive bits 1906 reconfigured to store the second check node data 422B of at least one additional second check node 402B-1 or 402B-2.

In some embodiments, the integrity engine 230 includes a min-sum decoder for implementing LDPC min-sum based decoding. Referring to FIG. 4, in LDPC decoding, each check node 402 stores an index (i.e., the first index data item 430) representing a variable node 404 providing minimum message value (i.e., the first likelihood data item 426). A range of the index depends on a number of variable nodes 404 connected to the check node 402 in the Tanner Graph 400. The number of variable nodes 404 connected to each check node 402 is called a check node degree or a row weight of the parity check H matrix. When the integrity engine 230 re-uses the same min-sum decoder hardware for different LDPC codes, a trade-off exists between the number of check nodes and a number of min index bits (e.g., of the index data item 430 or 432), resulting in a smaller overall number of flip-flops by having a smaller number of min index bits when a larger number of check nodes are needed.

In some embodiments, the integrity engine 230 reuses the same hardware (e.g., logics and registers) to decode different LDPC codes. Some LDPC matrices need 6 bits for the first likelihood data item 426 and some need 7 bits, depending on the row weight of the H matrix. In some situations, the LDPC matrices with higher code rates have fewer check nodes and higher row weights, requiring more bits in the first index data item 430. For example, the integrity engine 230 uses multiplexers to use the same flip flops for check nodes having a 6-bit index data item 430 or for fewer check nodes having a more than 6-bit index data item 430. More specifically, in an example, the integrity engine 230 save 1 bit storage space in the registers 232 for each check node 402. As such, compression MSBs of the subset of check nodes helps conserve expensive register space of the integrity check system 300.

FIG. 20 is a flow diagram of a method 2000 for adaptively storing check node data 422 in an electronic device, in accordance with some embodiments. The method 2000 is implemented at an electronic device including a memory system 200 (FIG. 2). At step 2002, the electronic device obtains a block of data corresponding to a plurality of first check nodes 402A. At step 2004, each first check node corresponds to a first subset of codeword symbols of the block of data, and has respective first check node data 422A that indicates a likelihood of the first subset of codeword symbols being erroneous. At step 2006, the electronic device identifies a memory block allocated to store first check node data of the plurality of first check nodes 402A. At step 2008, the electronic device regroups data bits of the block of data to form a plurality of second check nodes 402B. At step 2010, each second check node 402B corresponds to a second subset of codeword symbols of the block of data, and has respective second check node data 422B that indicates a likelihood of the second subset of codeword symbols being erroneous. At step 2012, the electronic device reconfigures the memory block to store second check node data of the plurality of second check nodes 402B. At step 2014, the plurality of second check nodes 402B has a distinct number of check nodes from the plurality of first check nodes 402A.

In some embodiments, at step 2016, the electronic device identifies one or more excessive bits 1906 in the respective first check node data 422A of each of the plurality of first check nodes 402A. At step 2018, the electronic device groups excessive bits 1906 of the respective first check node data 422A of a first subset of the plurality of first check nodes 402A to store additional check node data of an additional check node 402B-1 or 402B-2 of the plurality of second check nodes 402B. Further, in some embodiments, the additional check node includes a first additional check node 402B-1. The electronic device groups excessive bits 1906 of the respective first check node data 422A of a second subset of the plurality of first check nodes 402A to store additional check node data of a second additional check node 402B-2 of the plurality of second check nodes 402B. In some embodiments, for a third subset of the plurality of first check nodes 402A, a subset or all of the excessive bits of the respective first check node data 422A are not reassigned to store any additional check node data of the plurality of second check nodes 402B. In some embodiments, one excessive bit 1906 is identified in respective first check node data 422A of each of the plurality of first check nodes 402A, and the excessive bits 1906 of the respective first check node data 422A of the plurality of first check nodes 402A are grouped to store the additional check node data of two or more additional check nodes 402B-1 or 402B-2, including the additional check node, of the plurality of second check nodes 402B.

In some embodiments, at step 2020, the electronic device identifies one or more excessive check nodes 402A-1 or 402A-2 in the plurality of first check nodes 402A. Excessive check node data of the one or more excessive check nodes 402A-1 or 402A-2 forms a plurality of excessive bits 1902. At step 2022, the electronic device assigns the plurality of excessive bits 1902 to second check node data 422B of the plurality of second check nodes 402B. Further, in in some embodiments, assigning the plurality of excessive bits 1902 to the second check node data 422B of the plurality of second check nodes 402B further includes: (1) assigning a first set of excessive bits 1902A of excessive check node data of a first excessive check node to store the second check node data 422B of a first subset of the plurality of second check nodes 402B; and (2) assigning a second set of excessive bits 1902B of the excessive check node data of a second excessive check node to store the second check node data 422B of a second subset of the plurality of second check nodes 402B. In some embodiments, the plurality of excessive bits 1902 includes at least one remaining bit 1904 that is not assigned to any of the second check node data 422B of the plurality of second check nodes 402B. In some embodiments, one excessive check node is identified in each of the plurality of first check nodes 402A to provide the plurality of excessive bits, and a respective subset of the plurality of excessive bits is assigned to the second check data of each and every second check node.

In some embodiments, for each of the plurality of first check nodes 402A and the plurality of second check nodes 402B, the respective check node data includes a first likelihood data item 426 and an index data item 430 identifying one of the respective subsets of codeword symbols corresponding to the first likelihood data item 426. Further, in some embodiments, the first subset of codeword symbols includes a first number of codeword symbols, and the second subset of codeword symbols includes a second number of codeword symbols. The first number is greater than the second number. The index data item 430 of each of the plurality of first check nodes 402A includes at least one excessive bit 1906 to address the first number of codeword symbols than the index data item of each of the plurality of second check nodes 402B. The at least one excessive bit 1906 of each of the plurality of first check nodes 402A forms a plurality of excessive bits 1906 reconfigured to store the second check node data 422B of at least one additional second check node 402B-1 or 402B-2. In some embodiments, the first subset of codeword symbols includes a first number of codeword symbols, and the second subset of codeword symbols includes a second number of codeword symbols. The first number is less than the second number. An excessive check node 402A-1 or 402A-2 has excessive check node data 422A including a plurality of excessive bits 1902; and the plurality of excessive bits 1902 is assigned to index data items 430 or 432 of second check node data 422B of the plurality of second check nodes 402B.

In some embodiments, for each of the first and second check nodes, the subset of codeword symbols corresponds to a set of likelihood data items. Each likelihood data item indicates a likelihood of a respective codeword symbol being erroneous. The electronic device identifies a first likelihood data item 426 and a second likelihood data item 428, in accordance with a determination that the second likelihood data item 428 is greater than or equal to the first likelihood data item 426 and less than or equal to remaining likelihood data items of the subset of codeword symbols. Further, in some embodiments, each likelihood data item of the respective codeword symbol is determined based on a log-likelihood ratio (LLR) that is approximated by equation (6).

In some embodiments, for each of the first and second check nodes, the check node data of the respective check node further includes a first index data item identifying one of the subsets of codeword symbols corresponding to a first likelihood data of the check node data 422.

In some embodiments, each of the subset of codeword symbols corresponds to a respective likelihood data item indicating a likelihood of the respective codeword symbol being erroneous. The check node data of the check node further includes a sign bit that is a combination of signs of respective likelihood data items of the subset of codeword symbols.

Memory is also used to store instructions and data associated with the method 2000, and includes high-speed random-access memory, such as DRAM, SRAM, DDR RAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory, optionally, includes one or more storage devices remotely located from one or more processing units. Memory, or alternatively the non-volatile memory within memory, includes a non-transitory computer readable storage medium. In some embodiments, memory, or the non-transitory computer readable storage medium of memory, stores the programs, modules, and data structures, or a subset or superset for implementing method 2000.

Some implementations of this application are directed to adaptively storing check node data in an electronic device. The electronic device obtains a block of data corresponding to first check nodes each of which has respective first check node data indicating a likelihood of a first subset of codeword symbols of the block of data being erroneous. The electronic device identifies a memory block allocated to store first check node data of the first check nodes and regroups data bits of the block of data to form second check nodes. Each second check node has respective second check node data that indicates a likelihood of a second subset of codeword symbols of the block of data being erroneous. The electronic device reconfigures the memory block to store second check node data of the second check nodes. The second check nodes have a distinct number of check nodes from the first check nodes. More specifically, some implementations of this application are described in the following clauses:

Clause 1. A method implemented at an electronic device for adaptively storing check node data, the method comprising: obtaining a block of data corresponding to a plurality of first check nodes, wherein each first check node corresponds to a first subset of codeword symbols of the block of data, and has respective first check node data that indicates a likelihood of the first subset of codeword symbols being erroneous; identifying a memory block allocated to store first check node data of the plurality of first check nodes; regrouping data bits of the block of data to form a plurality of second check nodes, each second check node corresponding to a second subset of codeword symbols of the block of data, and having respective second check node data that indicates a likelihood of the second subset of codeword symbols being erroneous; and reconfiguring the memory block to store second check node data of the plurality of second check nodes, the plurality of second check nodes having a distinct number of check nodes from the plurality of first check nodes.

Clause 2. The method of clause 1, further comprising: identifying one or more excessive bits in the respective first check node data of each of the plurality of first check nodes; and grouping excessive bits of the respective first check node data of a first subset of the plurality of first check nodes to store additional check node data of an additional check node of the plurality of second check nodes.

Clause 3. The method of clause 2, wherein the additional check node includes a first additional check node, and the method further comprises: grouping excessive bits of the respective first check node data of a second subset of the plurality of first check nodes to store additional check node data of a second additional check node of the plurality of second check nodes.

Clause 4. The method of clause 2 or 3, wherein for a third subset of the plurality of first check nodes, a subset or all of the excessive bits of the respective first check node data are not reassigned to store any additional check node data of the plurality of second check nodes.

Clause 5. The method of any of clauses 2-4, wherein one excessive bit is identified in respective first check node data of each of the plurality of first check nodes, and the excessive bits of the respective first check node data of the plurality of first check nodes are grouped to store the additional check node data of two or more additional check nodes, including the additional check node, of the plurality of second check nodes.

Clause 6. The method of clause 1, further comprising: identifying one or more excessive check nodes in the plurality of first check nodes, excessive check node data of the one or more excessive check nodes forming a plurality of excessive bits; and assigning the plurality of excessive bits to second check node data of the plurality of second check nodes.

Clause 7. The method of clause 6, assigning the plurality of excessive bits to the second check node data of the plurality of second check nodes further comprising: assigning a first set of excessive bits of excessive check node data of a first excessive check node to store the second check node data of a first subset of the plurality of second check nodes; and assigning a second set of excessive bits of the excessive check node data of a second excessive check node to store the second check node data of a second subset of the plurality of second check nodes.

Clause 8. The method of clause 6 or 7, wherein the plurality of excessive bits includes at least one remaining bit that is not assigned to any of the second check node data of the plurality of second check nodes.

Clause 9. The method of any of clauses 6-8, wherein one excessive check node is identified in each of the plurality of first check nodes to provide the plurality of excessive bits, and a respective subset of the plurality of excessive bits are assigned to the second check data of each and every second check node.

Clause 10. The method of any of clauses 1-9, wherein for each of the plurality of first check nodes and the plurality of second check nodes, the respective check node data includes a first likelihood data item and an index data item identifying one of the respective subsets of codeword symbols corresponding to the first likelihood data item.

Clause 11. The method of clause 10, wherein: the first subset of codeword symbols includes a first number of codeword symbols, and the second subset of codeword symbols includes a second number of codeword symbols, wherein the first number is greater than the second number; the index data item of each of the plurality of first check nodes includes at least one excessive bit to address the first number of codeword symbols than the index data item of each of the plurality of second check nodes; and the at least one excessive bit of each of the plurality of first check nodes forms a plurality of excessive bits reconfigured to store the second check node data of at least one additional second check node.

Clause 12. The method of clause 10, wherein, the first subset of codeword symbols includes a first number of codeword symbols, and the second subset of codeword symbols includes a second number of codeword symbols, wherein the first number is less than the second number; an excessive check node has excessive check node data including a plurality of excessive bits; and the plurality of excessive bits is assigned to index data items of second check node data of the plurality of second check nodes.

Clause 13. The method of any of clauses 1-12, wherein for each check node, the corresponding subset of codeword symbols corresponds to a set of likelihood data items, each likelihood data item indicating a likelihood of a respective codeword symbol being erroneous, and wherein the method further comprises: identifying a first likelihood data item and a second likelihood data item, in accordance with a determination that the second likelihood data item is greater than or equal to the first likelihood data item and less than or equal to remaining likelihood data items of the subset of codeword symbols.

Clause 14. The method of clause 13, wherein each likelihood data item of the respective codeword symbol is determined based on a log-likelihood ratio (LLR) that is represented as follows:

$$LLR(y) = \ln\frac{p(x=0 \mid y)}{p(x=1 \mid y)} = \ln\frac{p(y \mid x=0)}{p(y \mid x=1)}$$

where p(|) is a probability of a combination of data values, x is a value stored for the respective codeword symbol, and y is a correct value of the respective codeword symbol.

Clause 15. The method of any of clauses 1-14, wherein for each check node, the check node data of the check node further includes a first index data item identifying one of the subsets of codeword symbols corresponding to a first likelihood data of the check node data.

Clause 16. The method of any of clauses 1-15, wherein each of the subset of codeword symbols corresponds to a respective likelihood data item indicating a likelihood of the respective codeword symbol being erroneous, and wherein the check node data of the check node further includes a sign bit that is a combination of signs of respective likelihood data items of the subset of codeword symbols.

Clause 17. An electronic device, comprising: one or more processors; and memory having instructions stored thereon, which when executed by the one or more processors cause the processors to perform a method of any of clauses 1-16.

Clause 18. A non-transitory computer-readable storage medium, having instructions stored thereon, which when executed by one or more processors cause the processors to perform a method of any of clauses 1-16.

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise re-arranged in various embodiments. In some embodiments, the memory, optionally, stores a subset of the modules and data structures identified above. Furthermore, the memory, optionally, stores additional modules and data structures not described above.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it will be understood that, although the terms "first," "second," etc. may be used herein to describe various elements, these elements should not be limited by these terms. These terms are only used to distinguish one element from another.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

What is claimed is:

1. A method implemented at an electronic device for compressing check node data, the method comprising:
   identifying a plurality of check nodes associated with a block of data, each check node corresponding to a subset of codeword symbols in the block of data and having respective check node data that indicate a likelihood of the subset of codeword symbols being erroneous;
   for each of a subset of check nodes, identifying a set of most significant bits (MSBs) of one or more data items in the respective check node data;
   determining a set of data bits based on a plurality of MSB sets of the subset of check nodes, the plurality of MSB sets including the set of MSBs of the one or more data items in the respective check node data of each of the subset of check nodes; and
   storing, in a memory block allocated to the plurality of check nodes, the set of data bits in association with the subset of check nodes;
   wherein the plurality of MSB sets has a first number of data bits in total, and the set of data bits has a second number of data bits, the second number being smaller than the first number.

2. The method of claim 1, wherein for each of the subset of check nodes, the respective check node data includes a first likelihood data item and an index data item identifying one of the subsets of codeword symbols corresponding to the first likelihood data item, and the one or more data items include the index data item.

3. The method of claim 1, wherein the subset of check nodes includes 3 check nodes, and for each of the subset of check nodes, the set of MSBs of the one or more data items in the respective check node data includes 2 MSBs of the index data item.

4. The method of claim 1, wherein for each of the subset of check nodes:
the respective check node data includes a first likelihood data item corresponding to a first codeword symbol and a second likelihood data item corresponding to a second codeword symbol;
the one or more data items include the first likelihood data item and the second likelihood data item, and the set of MSBs includes a third number of MSBs of the first likelihood data item and a fourth number of MSBs of the second likelihood data item.

5. The method of claim 4, wherein the first likelihood data item is less than or equal to the second likelihood data item, and the third number and the fourth number are equal to 1.

6. The method of claim 5, wherein:
the subset of check nodes includes 3 check nodes, the plurality of MSB sets of the subset of check nodes includes 6 bits in total;
for each of the subset of check nodes, the set of MSBs has 3 value combinations of MSBs of the first and second likelihood data items; and
the plurality of MSB sets of the subset of check nodes has 3×3×3 value combinations of MSBs of the first and second likelihood data items, and the set of data bits has 5 bits for representing the 3×3×3 value combinations; and
the first number is greater than the second number by 1.

7. The method of claim 5, wherein:
the subset of check nodes includes 5, 6, or 7 check nodes;
for each of the subset of check nodes, the set of MSBs has 3 value combinations of MSBs of the first and second likelihood data items; and
the first number is greater than the second number by 2.

8. The method of claim 1, wherein determining the set of data bits based on the plurality of MSB sets further comprises:
identifying a lookup table;
identifying a combination of the plurality of MSB sets of the subset of check nodes in the lookup table; and
checking the lookup table to determine the set of data bits based on the combination of the plurality of MSB sets.

9. The method of claim 1, wherein determining the set of data bits based on the plurality of MSB sets further comprises:
identifying a predefined equation; determining a plurality of input values based on the plurality of MSB sets of the subset of check nodes;
determining an output value based on the predefined equation and the plurality of input values; and
determining the set of data bits from the output value.

10. The method of claim 1, storing the set of data bits in association with the subset of check nodes further comprising: storing the set of data bits and a plurality of remaining bit sets of the subset of check nodes jointly, the plurality of remaining bit sets including a set of remaining bits of the one or more data items in the check node data of each of the subset of check nodes.

11. An electronic device, comprising:
one or more processors; and
memory storing one or more programs configured for execution by the one or more processors, the one or more programs comprising instructions for:
identifying a plurality of check nodes associated with a block of data, each check node corresponding to a subset of codeword symbols in the block of data and having respective check node data that indicate a likelihood of the subset of codeword symbols being erroneous;
for each of a subset of check nodes, identifying a set of most significant bits (MSBs) of one or more data items in the respective check node data;
determining a set of data bits based on a plurality of MSB sets of the subset of check nodes, the plurality of MSB sets including the set of MSBs of the one or more data items in the respective check node data of each of the subset of check nodes; and
storing, in a memory block allocated to the plurality of check nodes, the set of data bits in association with the subset of check nodes;
wherein the plurality of MSB sets has a first number of data bits in total, and the set of data bits has a second number of data bits, the second number being smaller than the first number.

12. The electronic device of claim 11, wherein for each check node. the subset of codeword symbols corresponds to a set of likelihood data items, each likelihood data item indicating a likelihood of a respective codeword symbol being erroneous, the one or more programs comprising instructions for:
identifying a first likelihood data item and a second likelihood data item, in accordance with a determination that the second likelihood data item is greater than or equal to the first likelihood data item and less than or equal to remaining likelihood data items of the subset of codeword symbols.

13. The electronic device of claim 12, wherein each likelihood data item of the respective codeword symbol is determined based on a log-likelihood ratio (LLR) that is approximated as follows:

$$LLR(y) = \ln\frac{p(x=0 \mid y)}{p(x=1 \mid y)} = \ln\frac{p(y \mid x=0)}{p(y \mid x=1)}$$

where p (|) is a probability of a combination of data values, x is a value stored for the respective codeword symbol, and y is a correct value of the respective codeword symbol.

14. The electronic device of claim 11, wherein for each check node, the check node data of the check node further includes a first index data item identifying one of the subset of codeword symbols corresponding to a first likelihood data item of the check node data.

15. The electronic device of claim 11, wherein each of the subset of codeword symbols corresponds to a respective likelihood data item indicating a likelihood of the respective codeword symbol being erroneous, and wherein the check node data of the check node further includes a sign bit that is a combination of signs of respective likelihood data items of the subset of codeword symbols.

16. A non-transitory computer-readable storage medium storing one or more programs to be executed by one or more processors for compressing check node data, the one or more programs comprising instructions for:

identifying a plurality of check nodes associated with a block of data, each check node corresponding to a subset of codeword symbols in the block of data and having respective check node data that indicate a likelihood of the subset of codeword symbols being erroneous;

for each of a subset of check nodes, identifying a set of most significant bits (MSBs) of one or more data items in the respective check node data;

determining a set of data bits based on a plurality of MSB sets of the subset of check nodes, the plurality of MSB sets including the set of MSBs of the one or more data items in the respective check node data of each of the subset of check nodes; and storing, in a memory block allocated to the plurality of check nodes, the set of data bits in association with the subset of check nodes;

wherein each of the plurality of MSB sets has a first number of data bits in total, and the set of data bits has a second number of data bits, the second number being smaller than the first number.

17. The non-transitory computer-readable storage medium of claim 16, wherein for each of the subset of check nodes, the respective check node data includes a first likelihood data item and an index data item identifying one of the subsets of codeword symbols corresponding to the first likelihood data item, and the one or more data items include the index data item.

18. The non-transitory computer-readable storage medium of claim 16, wherein the subset of check nodes includes 3 check nodes, and for each of the subset of check nodes, the set of MSBs of the one or more data items in the respective check node data includes 2 MSBs of the index data item.

19. The non-transitory computer-readable storage medium of claim 16, wherein for each of the subset of check nodes:

the respective check node data includes a first likelihood data item corresponding to a first codeword symbol and a second likelihood data item corresponding to a second codeword symbol;

the one or more data items include the first likelihood data item and the second likelihood data item, and the set of MSBs includes a third number of MSBs of the first likelihood data item and a fourth number of MSBs of the second likelihood data item.

20. The non-transitory computer-readable storage medium of claim 16, wherein determining the set of data bits based on the plurality of MSB sets further comprises:

identifying a lookup table;

identifying a combination of the plurality of MSB sets of the subset of check nodes in the lookup table; and checking the lookup table to determine the set of data bits based on the combination of the plurality of MSB sets.

\* \* \* \* \*